(12) United States Patent
Park et al.

(10) Patent No.: US 11,056,551 B2
(45) Date of Patent: Jul. 6, 2021

(54) DISPLAY DEVICE

(71) Applicant: Samsung Display Co., Ltd., Yongin-Si (KR)

(72) Inventors: Hye-Hyang Park, Yongin-si (KR); Joo-Hee Jeon, Anyang-si (KR); Seung-Ho Jung, Hwaseong-si (KR); Chaun-Gi Choi, Suwon-si (KR); Hyeon-Sik Kim, Yongin-si (KR); Hui-Won Yang, Seoul (KR); Eun-Young Lee, Suwon-si (KR)

(73) Assignee: Samsung Display Co., . Ltd.

( * ) Notice: Subject to any disclaimer, the term of this patent is extended or adjusted under 35 U.S.C. 154(b) by 22 days.

(21) Appl. No.: 16/556,166

(22) Filed: Aug. 29, 2019

(65) Prior Publication Data

US 2019/0386084 A1 Dec. 19, 2019

Related U.S. Application Data

(63) Continuation of application No. 15/416,653, filed on Jan. 26, 2017, now Pat. No. 10,418,431.

(30) Foreign Application Priority Data

Jan. 29, 2016 (KR) ........................ 10-2016-0011355

(51) Int. Cl.
*H01L 27/32* (2006.01)
*H01L 51/00* (2006.01)
*H01L 51/52* (2006.01)
*H01L 29/786* (2006.01)
(Continued)

(52) U.S. Cl.
CPC ........ *H01L 27/3262* (2013.01); *H01L 27/326* (2013.01); *H01L 27/3211* (2013.01);
(Continued)

(58) Field of Classification Search
CPC ............ H01L 2924/13092; H01L 2924/13081
See application file for complete search history.

(56) References Cited

U.S. PATENT DOCUMENTS

| 5,508,532 A | 4/1996 | Teramoto |
| 2004/0066136 A1 | 4/2004 | Yoneda et al. |
| (Continued) | | |

FOREIGN PATENT DOCUMENTS

| KR | 10-2010-0031374 A | 3/2010 |
| KR | 10-2010-0070085 A | 6/2010 |
| KR | 10-2014-0052451 A | 5/2014 |

OTHER PUBLICATIONS

EP Search Report corresponding to European Patent Application No. 17153634.5, dated Jun. 9, 2017, 7 pages.

*Primary Examiner* — Michelle Mandala
*Assistant Examiner* — Jordan M Klein
(74) *Attorney, Agent, or Firm* — Innovation Counsel LLP

(57) ABSTRACT

A display device may include a light emitting element, a buffer layer, a gate insulation layer, and a switching element. A refractive index of the gate insulation layer may be equal to a refractive index of the buffer layer. The switching element may be electrically connected to the light emitting element and may include an active layer and a gate electrode. The active layer may be positioned between the buffer layer and the gate insulation layer and may directly contact at least one of the buffer layer and the gate insulation layer. The gate insulation layer may be positioned between the active layer and the gate electrode and may directly contact at least one of the active layer and the gate electrode.

22 Claims, 35 Drawing Sheets

(51) Int. Cl.
  *H01L 27/12*  (2006.01)
  *H01L 29/51*  (2006.01)
(52) U.S. Cl.
  CPC ...... *H01L 27/3246* (2013.01); *H01L 27/3248* (2013.01); *H01L 27/3258* (2013.01); *H01L 51/0096* (2013.01); *H01L 51/5253* (2013.01); *H01L 51/5256* (2013.01); *H01L 51/5275* (2013.01); *H01L 27/1222* (2013.01); *H01L 27/1248* (2013.01); *H01L 29/513* (2013.01); *H01L 29/78645* (2013.01); *H01L 29/78666* (2013.01); *H01L 29/78675* (2013.01); *H01L 51/0097* (2013.01); *H01L 2251/301* (2013.01)

(56) References Cited

U.S. PATENT DOCUMENTS

| | | |
|---|---|---|
| 2005/0174047 A1 | 8/2005 | Shin |
| 2011/0163664 A1 | 7/2011 | Kang et al. |
| 2014/0231761 A1 | 8/2014 | Kim et al. |
| 2014/0353605 A1* | 12/2014 | Kim ............... H01L 27/124 257/40 |
| 2015/0090980 A1* | 4/2015 | Lee ............... H01L 27/1259 257/40 |
| 2015/0194443 A1* | 7/2015 | Chen ............... H01L 27/124 257/72 |
| 2016/0020266 A1* | 1/2016 | Park ............... H01L 27/1237 257/40 |
| 2016/0035809 A1 | 2/2016 | Park et al. |
| 2016/0043349 A1 | 2/2016 | Park et al. |
| 2016/0093647 A1* | 3/2016 | Kim ............... H01L 29/66757 349/46 |
| 2016/0126494 A1 | 5/2016 | Jung et al. |
| 2016/0181333 A1 | 6/2016 | Park et al. |
| 2016/0233289 A1 | 8/2016 | Son et al. |
| 2016/0254337 A1 | 9/2016 | Choi et al. |
| 2017/0084635 A1 | 3/2017 | Jung et al. |
| 2017/0104048 A1 | 4/2017 | Chung et al. |
| 2017/0229529 A1 | 8/2017 | Jung et al. |

* cited by examiner

DISPLAY DEVICE

CROSS-REFERENCE TO RELATED APPLICATION(S)

This application is a continuation application of U.S. patent application Ser. No. 15/416,653 filed Jan. 26, 2017, which claims priority to and the benefit of Korean Patent Application No. 10-2016-0011355, filed on Jan. 29, 2016, in the Korean Intellectual Property Office, the disclosure of which is incorporated herein in its entirety by reference.

BACKGROUND

1. Field

The technical field is related to a display device, e.g., an organic light emitting display device.

2. Description of the Related Art

Various display devices have been widely used in electronic devices. Display devices may include liquid crystal display (LCD) devices and organic light emitting display (OLED) devices.

A display device, such as an OLED device, may include a substantially transparent region for showing an object (or a target) that is located in the rear (e.g., the back) of the display device. The display device may also include a pixel region that can emit light for displaying an image. Multiple insulation layers may be disposed in both the transparent region and the pixel region. Refractive indexes of the insulation layers may be substantially different from each other. Therefore, transmissivity of the transparent region may be unsatisfactory. In addition, color characteristics associated with a light transmitted via the transparent region may be undesirably changed. One or more of the insulation layers may be based on nitride, may directly contact an active layer of the display device, and may negatively affect electron mobility of the active layer, such that performance of the display device may be unsatisfactory.

SUMMARY

Embodiments may be related to a display device, e.g., an organic light emitting display device, with satisfactory transmittance in a substantially transparent region of the display device.

Embodiments may be related to a display device, e.g., an organic light emitting display device, with satisfactory electron mobility in a switching element of the display device.

According to example embodiments, a display device, e.g., an organic light emitting display (OLED) device, includes a substrate, a buffer layer, a first gate insulation layer, an active layer, a first gate electrode, a first insulating interlayer, source and drain electrodes, and a pixel structure. The substrate includes a sub-pixel region (which corresponds to a sub-pixel of the display device) and a transparent region (which is substantially transparent). The buffer layer is disposed in the sub-pixel region and the transparent region on the substrate, and has a first refractive index. The first gate insulation layer is disposed in the sub-pixel region and the transparent region on the buffer layer, and includes the same material(s) as the buffer layer. The active layer is disposed between the buffer layer and the first gate insulation layer. The first gate electrode is disposed on the first gate insulation layer under which the active layer is disposed. The first insulating interlayer covers the first gate electrode on the first gate insulation layer, and is disposed in the sub-pixel region and the transparent region. The first insulating interlayer has a second refractive index that is greater than the first refractive index. The source and drain electrodes are disposed on the first insulating interlayer, and define a switching element together with the active layer and the first gate electrode. The pixel structure is disposed on the switching element, and is electrically connected to the switching element.

In example embodiments, the first refractive index may be in a range from 1.4 to 1.5, and the second refractive index may be in a range from 1.7 to 1.8.

In example embodiments, an upper surface of the active layer may be in contact with the first gate insulation layer, and a lower surface of the active layer may be in contact with the buffer layer.

In example embodiments, the substrate may include transparent insulation material(s).

In example embodiments, the substrate may consist essentially of a transparent polyimide substrate that has a refractive index in a range from 1.7 to 1.8.

In example embodiments, the substrate may include a transparent polyimide layer and a barrier layer, and the barrier layer may be interposed between the transparent polyimide layer and the buffer layer. The barrier layer and the first insulating interlayer may include the same material(s).

In example embodiments, the barrier layer may include organic material(s) or inorganic material(s) that have a refractive index in a range from 1.7 to 1.8.

In example embodiments, the barrier layer may consist essentially of silicon oxynitride that has a refractive index in a range from 1.7 to 1.8.

In example embodiments, the silicon oxynitride may consist essentially of silicon, oxygen, and nitrogen in a weight ratio of about 3.95:1:1.7.

In example embodiments, each of the buffer layer and the first gate insulation layer may include organic material(s) or inorganic material(s) that have a refractive index in a range from 1.4 to 1.5.

In example embodiments, each of the buffer layer and the first gate insulation layer may consist essentially of silicon oxide that has a refractive index in a range from 1.4 to 1.5.

In example embodiments, the active layer may consist essentially of amorphous silicon or polysilicon.

In example embodiments, the first insulating interlayer may include organic material(s) or inorganic material(s) that have a refractive index in a range from 1.7 to 1.8.

In example embodiments, the first insulating interlayer may consist essentially of silicon oxynitride that has a refractive index in a range from 1.7 to 1.8.

In example embodiments, the silicon oxynitride may consist essentially of silicon, oxygen, and nitrogen in a weight ratio of about 3.95:1:1.7.

In example embodiments, the OLED device may further include a second gate insulation layer. The second gate insulation layer may be interposed between the first gate insulation layer and the first insulating interlayer, and may be in the sub-pixel region and the transparent region.

In example embodiments, the second gate insulation layer and the first insulating interlayer may include the same material(s).

In example embodiments, the second gate insulation layer may consist essentially of silicon oxynitride that has a refractive index in a range from 1.7 to 1.8.

In example embodiments, the silicon oxynitride may consist essentially of silicon, oxygen, and nitrogen in a weight ratio of about 3.95:1:1.7.

In example embodiments, the OLED device may further include a second gate electrode. The second gate electrode may be interposed between the second gate insulation layer and the first insulating interlayer, and may be disposed on the second gate insulation layer under which the first gate electrode is disposed.

In example embodiments, the OLED device may further include a second insulating interlayer. The second insulating interlayer may be interposed between the first insulating interlayer and the source and drain electrodes, and may be in the sub-pixel region and the transparent region. The second insulating interlayer may have the first refractive index.

In example embodiments, the second insulating interlayer may consist essentially of silicon oxide that has a refractive index in a range from 1.4 to 1.5.

In example embodiments, the OLED device may further include a second gate electrode. The second gate electrode may be interposed between the first insulating interlayer and the second insulating interlayer, and may be disposed on the first insulating interlayer under which the first gate electrode is disposed.

In example embodiments, the OLED device may further include a planarization layer. The planarization layer may cover the source and drain electrodes on the first insulating interlayer.

In example embodiments, the planarization layer may be disposed in the sub-pixel region on the first insulating interlayer, and may expose the transparent region.

In example embodiments, the planarization layer may be disposed in the sub-pixel region and the transparent region on the first insulating interlayer, and may have the first refractive index.

In example embodiments, the planarization layer may have a first height in the sub-pixel region, and the first height may extend in a direction that is vertical to an upper surface of the substrate. The planarization layer may have a second height in the transparent region, and the second height extending in the direction may be less than the first height.

In example embodiments, the pixel structure may include a first electrode, a light emitting layer, and a second electrode. The first electrode may be disposed on the first insulating interlayer. The light emitting layer may be disposed on the first electrode. The second electrode may be disposed on the light emitting layer.

In example embodiments, the second electrode may be disposed in the sub-pixel region and the transparent region.

In example embodiments, the OLED device may further include a thin film encapsulation structure. The thin film encapsulation structure may be disposed on the pixel structure, and may include at least one a first encapsulation layer and at least one a second encapsulation layer. The first and second encapsulation layers may be alternately arranged.

In example embodiments, the first encapsulation layer may include inorganic material(s) that have a refractive index in a range from 1.4 to 1.6. The second encapsulation layer may include organic material(s) that have a refractive index in a range from 1.4 to 1.6.

In example embodiments, the first encapsulation layer may include silicon oxynitride.

In example embodiments, the second electrode may be disposed in the sub-pixel region, and exposes the transparent region. The thin film encapsulation structure may be in contact with the first insulating interlayer in the transparent region.

In example embodiments, the substrate may consist essentially of a glass substrate that has a refractive index in a range from 1.4 to 1.5.

In example embodiments, the buffer layer and the first gate insulation layer may consist essentially of silicon oxide that has a refractive index in a range from 1.4 to 1.5.

In example embodiments, the active layer may consist essentially of amorphous silicon or poly silicon.

In example embodiments, the first insulating interlayer may consist essentially of silicon oxynitride that has a refractive index in a range from 1.7 to 1.8.

In example embodiments, the silicon oxynitride may consist essentially of silicon, oxygen, and nitrogen in a weight ratio of about 3.95:1:1.7.

In example embodiments, the OLED device may further include a second gate insulation layer. The second gate insulation layer may be interposed between the first gate insulation layer and the first insulating interlayer, and may be disposed in the sub-pixel region and the transparent region. The second gate insulation layer may consist essentially of silicon oxynitride that has a refractive index in a range from 1.7 to 1.8.

In example embodiments, silicon oxynitride may consist essentially of silicon, oxygen, and nitrogen in a weight ratio of about 3.95:1:1.7.

In example embodiments, the OLED device may further include a second gate electrode. The second gate electrode may be interposed between the second gate insulation layer and the first insulating interlayer, and may be disposed on the second gate insulation layer under which the first gate electrode is disposed.

In example embodiments, the OLED device may further include a second insulating interlayer. The second insulating interlayer may be interposed between the first insulating interlayer and the source and drain electrodes, and may be disposed in the sub-pixel region and the transparent region. The second insulating interlayer may have the first refractive index. The second insulating interlayer may consist essentially of silicon oxide that has a refractive index in a range from 1.4 to 1.5.

In example embodiments, the OLED device may further include a second gate electrode. The second gate electrode may be interposed between the first insulating interlayer and the second insulating interlayer, and may be disposed on the first insulating interlayer under which the first gate electrode is disposed.

In example embodiments, the OLED device may further include a planarization layer. The planarization layer may cover the source and drain electrodes on the first insulating interlayer.

In example embodiments, the planarization layer may be disposed in the sub-pixel region on the first insulating interlayer, and may expose the transparent region.

In example embodiments, the planarization layer may be disposed in the sub-pixel region and the transparent region on the first insulating interlayer, and may have the first refractive index.

In example embodiments, the planarization layer may have a first height in the sub-pixel region, and the first height may extend in a direction that is vertical to an upper surface of the substrate. The planarization layer may have a second height in the transparent region, and the second height extending in the direction may be less than the first height.

In example embodiments, the pixel structure may include a first electrode, a light emitting layer, and a second electrode. The first electrode may be disposed on the first insulating interlayer. The light emitting layer may be disposed on the first electrode. The second electrode may be disposed on the light emitting layer.

In example embodiments, the second electrode may be disposed in the sub-pixel region and the transparent region.

An embodiment may be related to a display device, e.g., an organic light emitting display device. The display device may include a light emitting element (e.g., an organic light emitting element), a buffer layer, a first gate insulation layer, and a switching element. A refractive index of the first gate insulation layer may be equal to a refractive index of the buffer layer. The switching element may be electrically connected to the light emitting element and may include an active layer, a first gate electrode, a source electrode, and a drain electrode. The active layer may be positioned between the buffer layer and the first gate insulation layer and may directly contact at least one of the buffer layer and the first gate insulation layer. The first gate insulation layer may be positioned between the active layer and the first gate electrode and may directly contact at least one of the active layer and the first gate electrode. Each of the source electrode and the drain electrode may directly contact the active layer.

The display device may include a pixel defining layer, which may have a first opening. The active layer may be positioned between a first portion of the buffer layer and a first portion of the first gate insulation layer in a direction perpendicular to a side (e.g., bottom side) of the buffer layer. A second portion of the first gate insulation layer may be positioned between a second portion of the buffer layer and the first opening in the direction perpendicular to a side of the buffer layer.

The buffer layer may directly contact the first gate insulation layer and may include no nitride. A material of the buffer layer may be identical to a material of the first gate insulation layer.

The refractive index of the buffer layer may be greater than or equal to 1.4 and may be less than or equal to 1.5.

The display device may include a first insulating interlayer. The first gate electrode may be positioned between the first gate insulation layer and the first insulating interlayer. A refractive index of the first insulating interlayer may be greater than the refractive index of the first gate insulation layer.

A difference between the refractive index of the first insulating interlayer and the refractive index of the first gate insulation layer may be greater than or equal to 0.2 and may be less than or equal to 0.4.

The refractive index of the first insulating interlayer may be greater than or equal to 1.7 and may be less than or equal to 1.8.

The first insulating interlayer may directly contact each of the first gate electrode and the first gate insulation layer.

The display device may include a second gate insulation layer, which may directly contact the first insulating interlayer and may be positioned between the first gate electrode and the first insulating interlayer. A refractive index of the second gate insulation layer may be equal to the refractive index of the first insulating interlayer.

The display device may include a pixel defining layer, which may have a first opening. A first portion of the second gate insulation layer may be positioned between the first gate electrode and a first portion of the first insulating interlayer in a direction perpendicular to a side of the buffer layer and may directly contact the first portion of the first insulating interlayer. A second portion of the first insulating interlayer may be positioned between a second portion of the second gate insulation layer and the first opening in the direction perpendicular to the side of the buffer layer.

The display device may include a second gate electrode, which may be positioned between the second gate insulation layer and the first insulating interlayer and may directly contact at least one of the second gate insulation layer and the first insulating interlayer.

The display device may include a second insulating interlayer. The first insulating interlayer may be positioned between the first gate electrode and the second insulating interlayer and may directly contact the second insulating interlayer. A refractive index of the second insulating interlayer may be less than the refractive index of the first insulating interlayer.

A difference between the refractive index of the first insulating interlayer and the refractive index of the second insulating interlayer may be greater than or equal to 0.2 and may be less than or equal to 0.4.

The refractive index of the second insulating interlayer may be equal to the refractive index of the buffer layer.

The display device may include a second gate electrode, which may be positioned between the first insulating interlayer and the second insulating interlayer and may directly contact at least one of the first insulating interlayer and the second insulating interlayer.

The display device may include: a transparent substrate. A refractive index of the transparent substrate may be equal to the refractive index of the first insulating interlayer or the refractive index of the buffer layer.

The display device may include a transparent polyimide layer and a barrier layer. The barrier layer may be positioned between the transparent polyimide layer and the buffer layer. The buffer layer may be positioned between the barrier layer and the active layer. A refractive index of the barrier layer may be equal to the refractive index of the first insulating interlayer.

A material of the barrier layer may be identical to a material of the first insulating interlayer. A weight proportion of silicon, oxygen, and nitrogen of the material of the barrier layer may be 3.95:1:1.7.

The display device may include an encapsulation layer. A refractive index of the encapsulation layer may be equal to the refractive index of the first insulating interlayer or the refractive index of the buffer layer. The light emitting element may be positioned between the first insulating interlayer and the encapsulation layer.

The display device may include an inorganic material layer and an organic material layer. A refractive index of the inorganic material layer may be equal to the refractive index of the first insulating interlayer or the refractive index of the buffer layer. The organic material layer may directly contact the inorganic material layer. A refractive index of the inorganic material layer may be equal to the refractive index of the first insulating interlayer or the refractive index of the buffer layer. One of the inorganic material layer and the organic material layer may directly contact the first insulating interlayer and may be positioned between the light emitting element and another one of the inorganic material layer and the organic material layer.

In a display device (e.g., an OLED device) according to embodiments, refractive indexes of immediately neighboring insulation layers may be substantially equal. Advantageously, the transmittance of a transparent region of the display device may be satisfactory. In embodiments, a display device (e.g., an OLED device) includes one or more insulation layers that enable desirable interface characteristics of an active layer in a switching element of the display device. Advantageously, electron mobility in the switching element may be satisfactory, such that performance of the display device may be satisfactory.

DETAILED DESCRIPTION OF THE EMBODIMENTS

Figure 1:
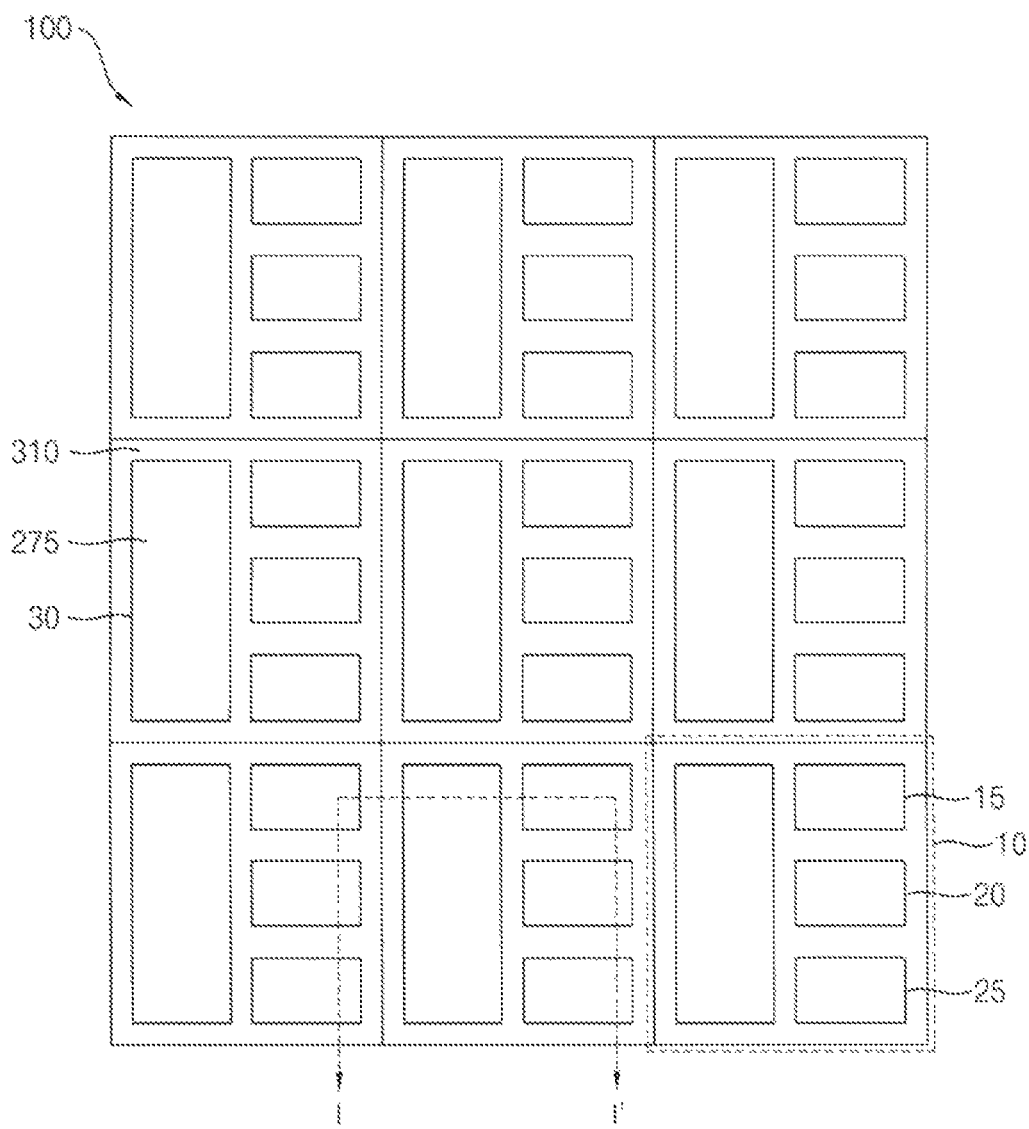
FIG. 1 is a plan view illustrating a display device, e.g., an organic light emitting display (OLED) device, in accordance with example embodiments.

Embodiments are explained with reference to the accompanying drawings.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect", "directly connect", or "indirectly connect". The term "insulate" may mean "electrically insulate". The term "conductive" may mean "electrically conductive". The term "electrically connected" may mean "electrically connected without any intervening transistors". If a component (e.g., a transistor) is described as connected between a first element and a second element, then a source/drain/input/output terminal of the component may be electrically connected to the first element through no intervening transistors, and a drain/source/output/input terminal of the component may be electrically connected to the second element through no intervening transistors.

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

FIG. 1 is a plan view illustrating a display device, e.g., an organic light emitting display (OLED) device, in accordance with example embodiments.

Referring to FIG. 1, an organic light emitting display (OLED) device 100 may include a plurality of pixel regions. One pixel region 10 among a plurality of pixel regions may include a first sub-pixel region 15, a second sub-pixel region 20, and a third sub-pixel region 25 and a transparent region 30. For example, the pixel regions 10 may be arranged in a first direction D1 and a second direction D2 on the entire substrate, which will be described below, included in the OLED device 100. Here, the first direction D1 (e.g., a direction from the transparent region 30 into the sub-pixel region 15) may be parallel to an upper surface of the substrate, and the second direction D2 may be perpendicular to the first direction D1.

The pixel regions 10 each may include the sub-pixel regions 15, 20, and 25 and a transparent region 30. The sub-pixel regions 15, 20, and 25 and a transparent region 30 may be substantially surrounded by a pixel defining layer 310. For example, the sub-pixel regions 15, 20, and 25 and a transparent region 30 may be defined by the pixel defining layer 310. That is, the pixel defining layer 310 may be disposed in one pixel region 10 except the sub-pixel regions 15, 20, and 25 and a transparent region 30.

First, second, and third sub-pixels may be disposed in the sub-pixel regions 15, 20, and 25, respectively. For example, the first sub-pixel may emit a red color of a light, and the second sub-pixel may emit a green color of a light. In addition, the third sub-pixel may emit a blue color of a light. The sub-pixels may be disposed at the same level on the substrate.

In the transparent region 30, a light incident from the outside may be transmitted via the transparent region 30. An opening 275 may be located in the transparent region 30.

Since the OLED device 100 includes the transparent region 30, the OLED device 100 may serve as a transparent OLED device capable of transmitting a light incident from the outside.

In example embodiments, one pixel region 10 includes three sub-pixel regions and one transparent region, but not being limited thereto. In some example embodiments, for example, a plurality of pixel regions may be corresponding to one transparent region.

In example embodiments, an arrangement of a plurality of pixel regions 10 is regularly arranged, but not being limited thereto. In some example embodiments, the pixel regions 10 may be irregularly arranged.

Figure 2A:
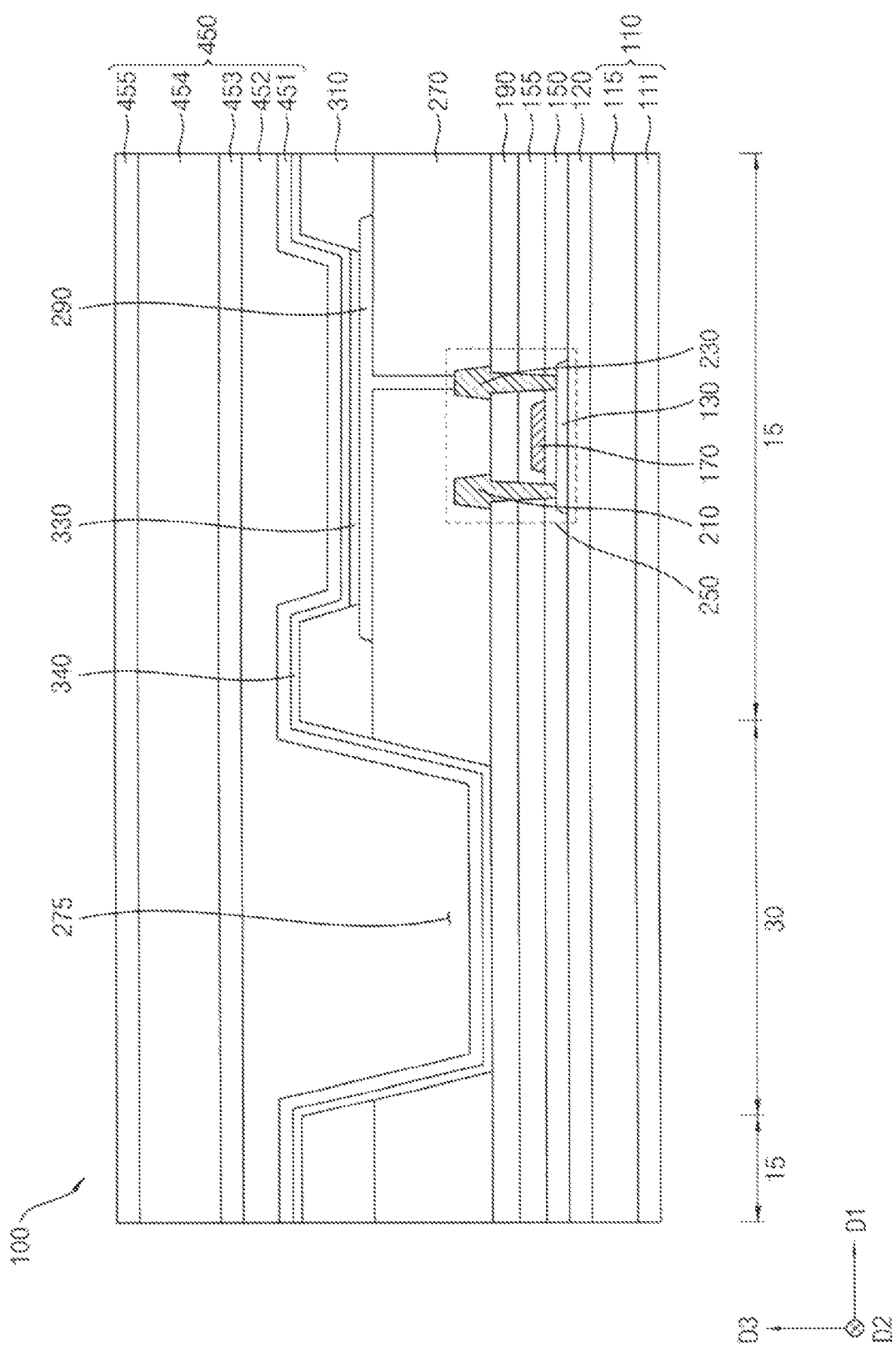
FIG. 2A is a cross-sectional view taken along a line I-I' indicated in FIG. 1.
Figure 2B:
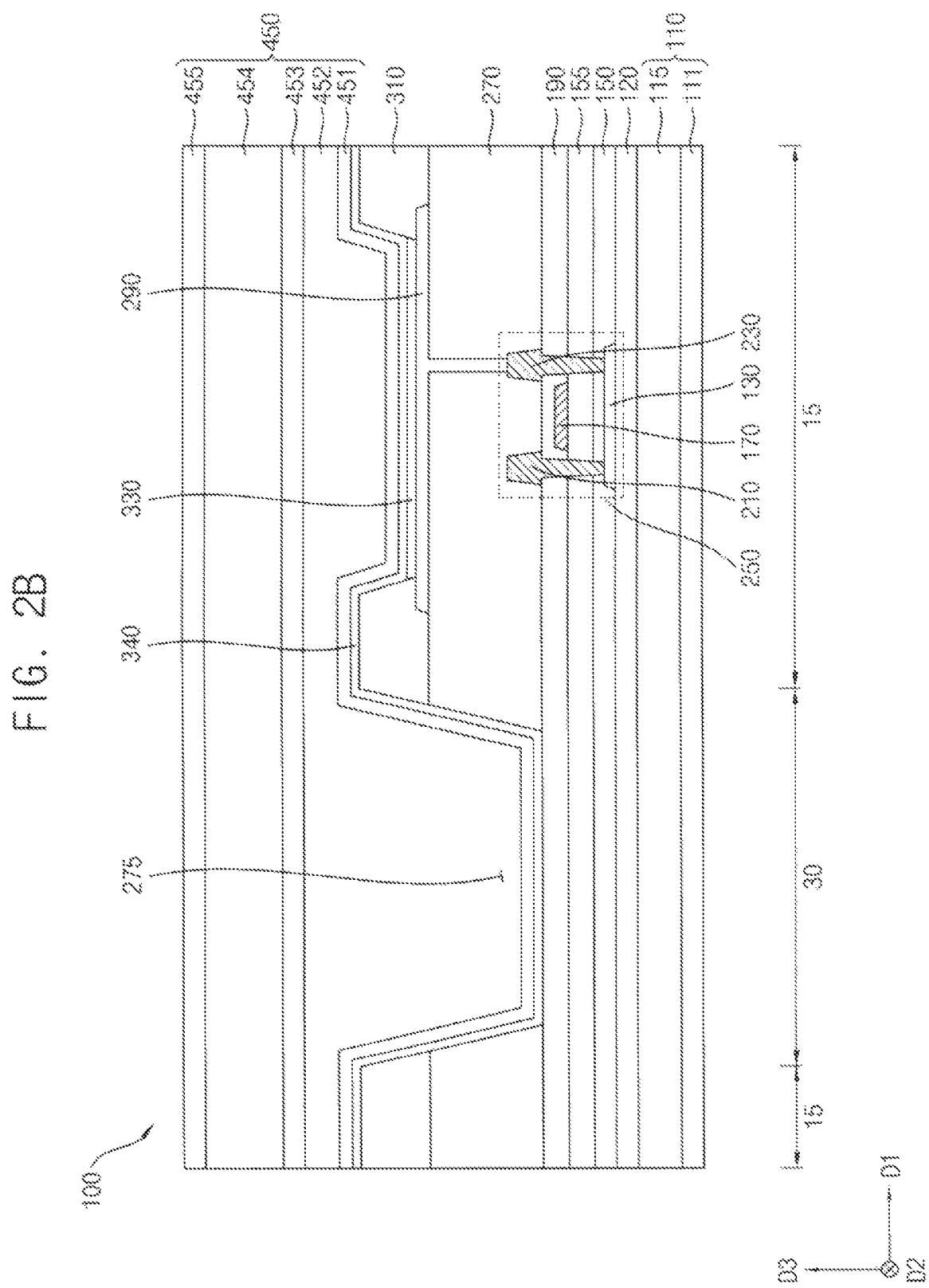
FIG. 2B is a cross-sectional view illustrating an OLED device in accordance with example embodiments.

FIG. 2A is a cross-sectional view taken along a line I-I' indicated in FIG. 1, and FIG. 2B is a cross-sectional view illustrating an OLED device in accordance with example embodiments.

Referring to FIG. 2A, an organic light emitting display (OLED) device 100 may include a substrate 110, a buffer layer 120, a semiconductor element 250 (e.g., a switching element 250), a first gate insulation layer 150, a second gate insulation layer 155, a pixel structure, a first insulating interlayer 190, a planarization layer 270, a pixel defining layer 310, a thin film encapsulation structure 450, etc. The substrate 110 may include a polyimide layer 111 and a barrier layer 115. The pixel structure (e.g., light emitting element) may include a first electrode 290, a light emitting layer 330 (e.g., an organic light emitting layer), and a second electrode 340. The switching element 250 may include an active layer 130, a first gate electrode 170, a source electrode 210, and a drain electrode 230. The thin film encapsulation structure 450 may include first encapsulation layers 451, 453, and 455 and second encapsulation layers 452 and 454.

As described above, the OLED device 100 may include a plurality of pixel regions. One pixel region among a plurality of pixel regions may have a sub-pixel region 15 (e.g., a first sub-pixel region of FIG. 1) and a transparent region 30.

The switching element 250, the first electrode 290, the light emitting layer 330, etc. may be disposed in the sub-pixel region 15. The insulation layers, etc. may be disposed in the transparent region 30. Meanwhile, the second electrode 340 may be entirely disposed in the sub-pixel region 15 and the transparent region 30.

A display image may be displayed in the sub-pixel region 15, and an object (or a target) that is located in the back (or the rear) of the OLED device 100 may be visible in the transparent region 30. As the OLED device 100 includes the transparent region 30, the OLED device 100 may serve as a transparent OLED device 100.

The substrate 110 may include transparent insulation material(s). In example embodiments, the substrate 110 may essentially include a transparent polyimide substrate. The transparent polyimide substrate may be formed of a flexible transparent resin substrate. In this case, the transparent polyimide substrate may include the polyimide layer 111 and the barrier layer 115. For example, the transparent polyimide substrate may have a structure that the polyimide layer 111 and the barrier layer 115 are stacked on a rigid glass substrate. In a manufacturing the OLED device 100, after the buffer layer 120 is disposed on the barrier layer 115 of the transparent polyimide substrate, the semiconductor element 250 and the pixel structure may be disposed on the buffer layer 120. After the semiconductor element 250 and the pixel structure are formed, the rigid glass substrate may be removed. It may be difficult to directly form the semiconductor element 250 and the pixel structure on the transparent polyimide substrate because the transparent polyimide substrate is relatively thin and flexible. In embodiments, the semiconductor element 250 and the pixel structure are formed on the transparent polyimide substrate using the rigid glass substrate, and then the transparent polyimide substrate including the polyimide layer 111 and the barrier layer 115 may serve as the substrate 110 of the OLED device 100 after the removal of the rigid glass substrate. As the OLED device 100 includes the sub-pixel region 15 and the transparent region 30, the substrate 110 may also include the sub-pixel region 15 and the transparent region 30.

In example embodiments, a refractive index of the polyimide layer 111 may be in a range from about 1.7 to about 1.8. The polyimide layer 111 may include random copolymer or block copolymer. In addition, the polyimide layer 111 may have a high transparency, a low coefficient of thermal expansion, and a high glass transition temperature. Since the polyimide layer 111 includes an imide radical, a heat resistance, a chemical resistance, a wear resistance, and an electrical characteristics may be excellent.

The barrier layer 115 may include organic material(s) or inorganic material(s) that have a refractive index in a range from about 1.7 to about 1.8. The organic material(s) may include one or more of a photoresist, a polyacryl-based resin, a polyimide-based resin, a polyamide-based resin, a siloxane-based resin, an acryl-based resin, an epoxy-based resin, etc. In addition, the inorganic material(s) may include one or more of silicon compound, metal oxide, etc. For example, the barrier layer 115 may include one or more of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. In example embodiments, the barrier layer 115 may consist essentially of SiOxNy that has a refractive index from about 1.7 to about 1.8. In embodiments, the barrier layer 115 may have a substantially single composition of SiOxNy. The barrier layer 115 may block moisture or water capable of being permeated via the polyimide layer 111. In embodiments, the polyimide layer 111 and the barrier layer 115 may have substantially the same refractive index (value). For example, SiOxNy may consist essentially of silicon, oxygen, and nitrogen in a respective weight ratio of about 3.95:1:1.7. That is, SiOxNy may be formed controlling the weight ratio such that a refractive index of SiOxNy has a refractive index in a range from about 1.7 to about 1.8. In an embodiment, SiOxNy may consist essentially of silicon, oxygen, and nitrogen in a weight ratio of about 2.5:1:0.88.

In some example embodiments, the substrate 110 may include a quartz substrate, a synthetic quartz substrate, a calcium fluoride substrate, a fluoride-doping quartz substrate, a soda lime substrate, a non-alkali substrate etc.

The buffer layer 120 may be disposed on the substrate 110. The buffer layer 120 may include organic material(s) or inorganic material(s) that have a refractive index in a range from about 1.4 to about 1.5 (e.g., a first refractive index). In example embodiments, the buffer layer 120 may consist essentially of SiOx that has a refractive index from about 1.4 to about 1.5. In embodiments, the buffer layer 120 may have a substantially single composition of SiOx. The buffer layer 120 may be disposed on the entire substrate 110. The buffer layer 120 may prevent the diffusion of metal atoms and/or impurities from the substrate 110 into the switching element 250 and the pixel structure. Additionally, the buffer layer 120 may control a rate of a heat transfer in a crystallization process for forming the active layer 130, thereby obtaining a substantially uniform active layer 130. Furthermore, the buffer layer 120 may improve a surface flatness of the substrate 110 when a surface of the substrate 110 is relatively irregular. Further, as the buffer layer 120 is disposed on the substrate 110, the stress generated from the pixel structure formed on the substrate 110 may be reduced. A type of the substrate 110, at least two buffer layers may be provided on the substrate 110.

The switching element 250 may include the active layer 130, the first gate electrode 170, the source electrode 210, and the drain electrode 230, and may be disposed in the sub-pixel region 15 on the substrate 110.

The active layer 130 may be disposed in the sub-pixel region 15 on the substrate 110. For example, the active layer 130 may include an oxide semiconductor, an inorganic semiconductor (e.g., amorphous silicon, polysilicon, etc.), an organic semiconductor, etc. In example embodiments, the active layer 130 may consist essentially of amorphous silicon or polysilicon. A lower surface of the active layer 130 may be in contact with the buffer layer 120, and an upper surface of the active layer 130 may be in contact with the first gate insulation layer 150.

The first gate insulation layer 150 may be disposed on the active layer 130. The first gate insulation layer 150 may include organic material(s) or inorganic material(s) that have a refractive index in a range from about 1.4 to about 1.5. In example embodiments, the first gate insulation layer 150 may consist essentially of SiOx that has a refractive index from about 1.4 to about 1.5. In embodiments, the first gate insulation layer 150 may have a substantially single composition of SiOx. In addition, the buffer layer 120 and the first gate insulation layer 150 may have substantially the same refractive index (value). The first gate insulation layer 150 may extend in a first direction D1 (e.g., a direction that is from the transparent region 30 into the sub-pixel region 15) on the buffer layer 120. The first direction D1 may be parallel to an upper surface of the substrate 110. The first gate insulation layer 150 may cover the active layer 130 in the sub-pixel region 15, and may be disposed on the entire buffer layer 120. For example, the first gate insulation layer 150 may sufficiently cover the active layer 130, and may have a substantially even surface without a step around the active layer 130. In an embodiment, the first gate insulation layer 150 may cover the active layer 130, and may be disposed as a substantially uniform thickness along a profile of the active layer 130. In example embodiments, interface characteristics of the active layer 130 may be increased because an upper surface of the active layer 130 including amorphous silicon or polysilicon is in contact with the first gate insulation layer 150 including SiOx and a lower surface of the active layer 130 including amorphous silicon or polysilicon is in contact with the buffer layer 120 including SiOx. Meanwhile, when a nitride-based insulation layer is in contact with a silicon-based active layer 130, interface characteristics may be reduced. In example embodiments, an insulation layer including SiNx or SiOxNy may not be in direct contact with the active layer 130 in the OLED device 100. Accordingly, desirable interface characteristics of the active layer 130 may be attained, and performance of the switching element 250 included in the OLED device 100 may be satisfactory.

The first gate electrode 170 may be disposed on the first gate insulation layer 150. The first gate electrode 170 may be disposed on the first gate insulation layer 150 under which the active layer 130 is disposed. The first gate electrode 170 may include a metal, a metal alloy, metal nitride, conductive metal oxide, transparent conductive material(s), etc. For example, the first gate electrode 170 may include gold (Au), silver (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. In an embodiment, the first gate electrode 170 may have a multilayer structure.

The second gate insulation layer 155 may be disposed on the first gate electrode 170. The second gate insulation layer 155 may include organic material(s) or inorganic material(s) that have a refractive index in a range from about 1.7 to about 1.8 (e.g., a second refractive index). In example embodiments, the second gate insulation layer 155 may consist essentially of SiOxNy that has a refractive index in a range from 1.7 to 1.8. In embodiments, the second gate insulation layer 155 may have a substantially single composition of SiOxNy. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88. In addition, the substrate 110 and the second gate insulation layer 155 may have substantially the same refractive index (value). As the second gate insulation layer 155 including SiOxNy is spaced from the active layer 130, desirable interface characteristics of the active layer 130 may be attained. For example, hydrogen may be injected in a process annealing the active layer 130. The hydrogen may combine with a dangling bond of the active layer 130. The second gate insulation layer 155 may support the hydrogen combination process. Accordingly, desirable interface characteristics of the active layer 130 may be attained, and a mean free path of electrons included in the active layer 130 may be desirable. That is, mobility of electron may be enhanced, and characteristics of the switching element 250 included in the OLED device 100 may be improved. The second gate insulation layer 155 may extend in the first direction D1 on the substrate 110. The second gate insulation layer 155 may cover the first gate electrode 170 in the sub-pixel region 15, and may be disposed on the entire first gate insulation layer 150. For example, the second gate insulation layer 155 may sufficiently cover the first gate electrode 170, and may have a substantially even surface without a step around the first gate electrode 170. In an embodiment, the second gate insulation layer 155 may cover the first gate electrode 170, and may be disposed as a substantially uniform thickness along a profile of the first gate electrode 170.

The first insulating interlayer 190 may be disposed on the second gate insulation layer 155. The first insulating interlayer 190 may include organic material(s) or inorganic material(s) that have a refractive index in a range from about 1.7 to about 1.8 (e.g., a second refractive index). In example embodiments, the first insulating interlayer 190 may consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88.

In embodiments, the first insulating interlayer 190 may have a substantially single composition of SiOxNy. In addition, the first insulating interlayer 190, the substrate 110 and the second gate insulation layer 155 may have substantially the same refractive index (value). In embodiments, as the substrate 110, the second gate insulation layer 155, and the first insulating interlayer 190 have substantially the same refractive index (value), a transmittance in the transparent region 30 of the OLED device 100 may be increased. The first insulating interlayer 190 may extend in the first direction D1 on the second gate insulation layer 155.

In some example embodiments, as illustrated in FIG. 2B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the first gate electrode 170. Here, the first gate insulation layer 150 may consist essentially of SiOx that has a refractive index from about 1.4 to about 1.5, and the first gate electrode 170 may include a metal, a metal alloy, metal nitride, conductive metal oxide, transparent conductive material(s), etc. In addition, the second gate insulation layer 155 may consist essentially of SiOxNy that has a refractive index in a range from 1.7 to 1.8, and SiOxNy may consist essentially of silicon, oxygen, and nitrogen in a weight ratio of about 2.5:1:0.88. The first insulating interlayer 190 may be disposed on the second gate insulation layer 155 and the first gate electrode 170. The first insulating interlayer 190 may consist essentially of SiOxNy that has a refractive index in a range from 1.7 to 1.8, and SiOxNy may consist essentially of silicon, oxygen, and nitrogen in a weight ratio of about 2.5:1:0.88.

Referring again to FIG. 2A, the source electrode 210 and the drain electrode 230 may be disposed on the first insulating interlayer 190. The source electrode 210 may be in contact with a first side (e.g., a source region) of the active layer 130 via a contact hole formed by removing a portion of the first insulating interlayer 190, the second gate insulation layer 155, and the first gate insulation layer 150 each. The drain electrode 230 may be in contact with a second side (e.g., a drain region) of the active layer 130 via a contact hole formed by removing a portion of the first insulating interlayer 190, the second gate insulation layer 155, and the first gate insulation layer 150 each. Each of the source electrode 210 and the drain electrode 230 may include a metal, an alloy, metal nitride, conductive metal oxide, transparent conductive material(s), etc. These may be used alone or in a suitable combination thereof. In embodiments, the switching element 250 may include the active layer 130, the first gate electrode 170, the source electrode 210, and the drain electrode 230.

The planarization layer 270 may be disposed on the source electrode 210 and the drain electrode 230. The planarization layer 270 may extend in the first direction D1 on the first insulating interlayer 190. The planarization layer 270 may have an opening 275 exposing the first insulating interlayer 190 in the transparent region 30, and may cover the source electrode 210 and the drain electrode 230 in the sub-pixel region 15. For example, the planarization layer 270 may be disposed as a relatively high thickness to sufficiently cover the source electrode 210 and the drain electrode 230. In this case, the planarization layer 270 may have a substantially even upper surface, and a planarization process may be further performed on the planarization layer 270 to implement the even upper surface of the planarization layer 270. In an embodiment, the planarization layer 270 may cover the source electrode 210 and the drain electrode 230, and may be disposed as a substantially uniform thickness along a profile of the source electrode 210 and the drain electrode 230. The planarization layer 270 may include organic material(s) or inorganic material(s).

The first electrode 290 may be disposed in the sub-pixel region 15 on the planarization layer 270. The first electrode 290 may be in contact with the drain electrode 230 via a contact hole formed by removing a portion of the planarization layer 270. In addition, the first electrode 290 may be electrically connected to the switching element 250. The first electrode 290 may include a metal, a metal alloy, metal nitride, conductive metal oxide, transparent conductive material(s), etc. These may be used alone or in a suitable combination thereof.

The pixel defining layer 310 may expose at least a portion of the first electrode 290, and then may be disposed on the planarization layer 270. For example, the pixel defining layer 310 may cover both lateral portions of the first electrode 290, and may expose the opening 275 of the planarization layer 270. In this case, the light emitting layer 330 may be disposed on the first electrode 290 exposed by the pixel defining layer 310. The pixel defining layer 310 may include inorganic material(s) or organic material(s).

The light emitting layer 330 may be disposed on a portion of the first electrode 290 that is exposed by the pixel defining layer 310. The light emitting layer 330 may have a multi-layered structure including an emission layer (EL), a hole injection layer (HIL), a hole transfer layer (HTL), an electron transfer layer (ETL), an electron injection layer (EIL), etc. The EL of the light emitting layer 330 may be formed using at least one of light emitting material(s) capable of generating different colors of light (e.g., a red color of light, a blue color of light, and a green color of light, etc.) according to first, second, and third sub-pixels illustrated in FIG. 1. In an embodiment, the EL of the light emitting layer 330 may generally generate a white color of light by stacking a plurality of light emitting material(s) capable of generating different colors of light such as a red color of light, a green color of light, a blue color of light, etc. In some example embodiments, the HIL, the HTL, the ETL, the EIL, etc. except the EL may be disposed in the transparent region 30 on the first insulating interlayer 190.

The second electrode 340 may be disposed on the pixel defining layer 310, the light emitting layer 330, a portion of the planarization layer 270, and a portion of the first insulating interlayer 190. The second electrode 340 may cover the pixel defining layer 310, the first insulating interlayer 190, the planarization layer 270, and the light emitting layer 330 in the sub-pixel region 15 and the transparent region 30. The second electrode 340 may include a metal, a metal alloy, metal nitride, conductive metal oxide, transparent conductive material(s), etc.

The thin film encapsulation structure 450 may be disposed on the second electrode 340. The thin film encapsulation structure 450 may include at least one first encapsulation layer and at least one second encapsulation layer. For example, the second encapsulation layer 452 may be disposed on the first encapsulation layer 451. The first encapsulation layers 451, 453, and 455 and the second encapsulation layers 452 and 454 may be alternately and repeatedly arranged. The first encapsulation layer 451 may cover the second electrode 340, and may be disposed as a substantially uniform thickness along a profile of the second electrode 340. The first encapsulation layer 451 may prevent the pixel structure form being deteriorated by the permeation of moisture, water, oxygen, etc. In addition, the first encapsulation layer 451 may protect the pixel structure from external impacts. The first encapsulation layer 451 may include inorganic material(s). In an embodiment, the first encapsulation layer 451 may include SiOxNy.

The second encapsulation layer 452 may be disposed on the first encapsulation layer 451. The second encapsulation layer 452 may improve a surface flatness of the OLED device 100, and may protect the pixel structure disposed in the sub-pixel region 15. The second encapsulation layer 452 may include organic material(s).

The first encapsulation layer 453 may be disposed on the second encapsulation layer 452. The first encapsulation layer 453 may cover the second encapsulation layer 452, and may be disposed as a substantially uniform thickness along a profile of the second encapsulation layer 452. The first encapsulation layer 453 together with the first encapsulation layer 451 and the second encapsulation layer 452 may prevent the pixel structure form being deteriorated by the permeation of moisture, water, oxygen, etc. In addition, the first encapsulation layer 453 together with the first encapsulation layer 451 and the second encapsulation layer 452 may protect the pixel structure from external impacts. The first encapsulation layer 453 may include inorganic material(s). In an embodiment, the first encapsulation layer 453 may include SiOxNy.

The second encapsulation layer 454 may be disposed on the first encapsulation layer 453. The second encapsulation layer 454 may perform functions substantially the same as or similar to those of the second encapsulation layer 452, and the second encapsulation layer 454 may include a material substantially the same as or similar to that of the second encapsulation layer 452. The first encapsulation layer 455 may be disposed on the second encapsulation layer 454. The first encapsulation layer 455 may perform functions substantially the same as or similar to those of the first encapsulation layers 451 and 453, and the first encapsulation layer 455 may include a material substantially the same as or similar to that of the first encapsulation layers 451 and 453. In some example embodiments, the thin film encapsulation structure 450 may have three layers structure having the first encapsulation layer 451, the second encapsulation layer 452, and the first encapsulation layer 453 or seven layers structure having the first encapsulation layer 451, the second encapsulation layer 452, the first encapsulation layer 453, the second encapsulation layer 454, the first encapsulation layer 455, an extra second encapsulation layer, and an extra first encapsulation layer. In an embodiment, the thin film encapsulation structure 450 may include organic material(s) or inorganic material(s) that have a refractive index in a range from 1.7 to 1.8. In some example embodiments, the thin film encapsulation structure 450 and the substrate 110 may include substantially the same material(s). For example, the thin film encapsulation structure 450 may include a quartz substrate, a synthetic quartz substrate, a calcium fluoride substrate, a fluoride-doping quartz substrate, a soda lime substrate, a non-alkali substrate etc.

As the OLED device 100 in accordance with example embodiments includes the second gate insulation layer 155 and the first insulating interlayer 190 that have substantially the same refractive index as the substrate 110, a transmittance of the transparent region 30 may be increased. In addition, as the active layer 130 is interposed between the buffer layer 120 and the first gate insulation layer 150 that have SiOx, interface characteristics of the active layer 130 may be improved. In embodiments, the OLED device 100 may serve as a flexible transparent OLED device that has a relatively high transmittance and has an effective switching element 250.

Figure 3:
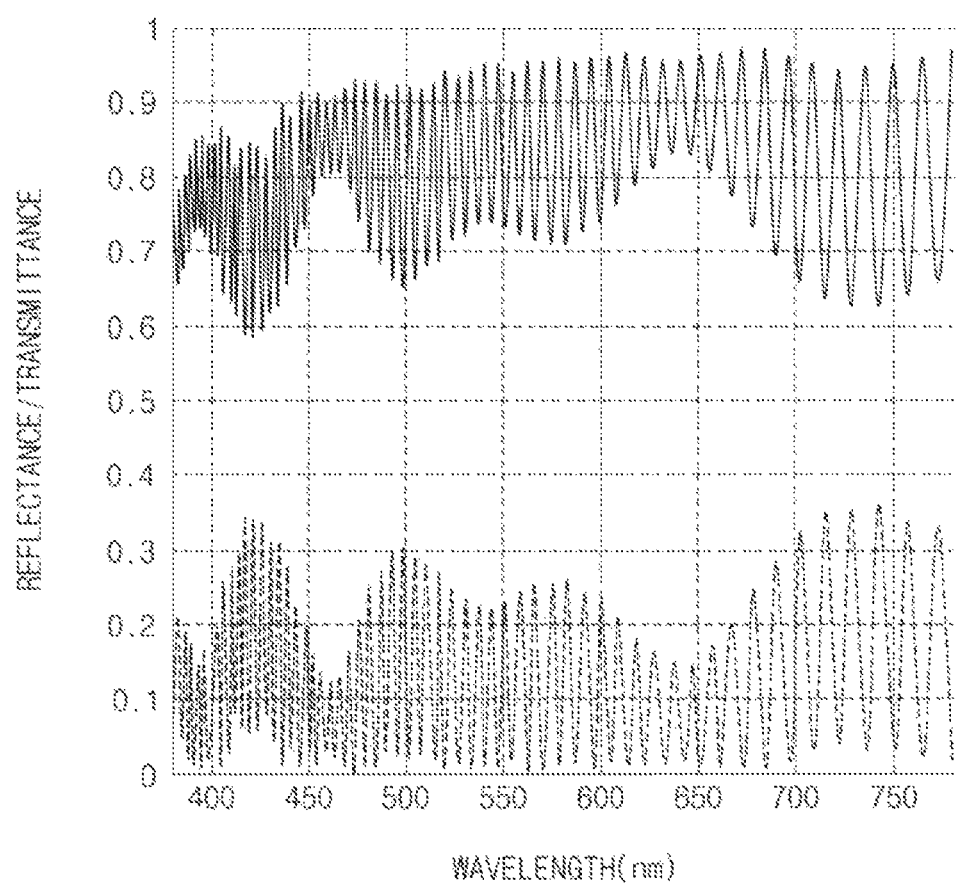
FIG. 3 and FIG. 4 are graphs illustrating an average transmittance of the OLED device of FIG. 1 and an average transmittance of a comparative example.
Figure 4:
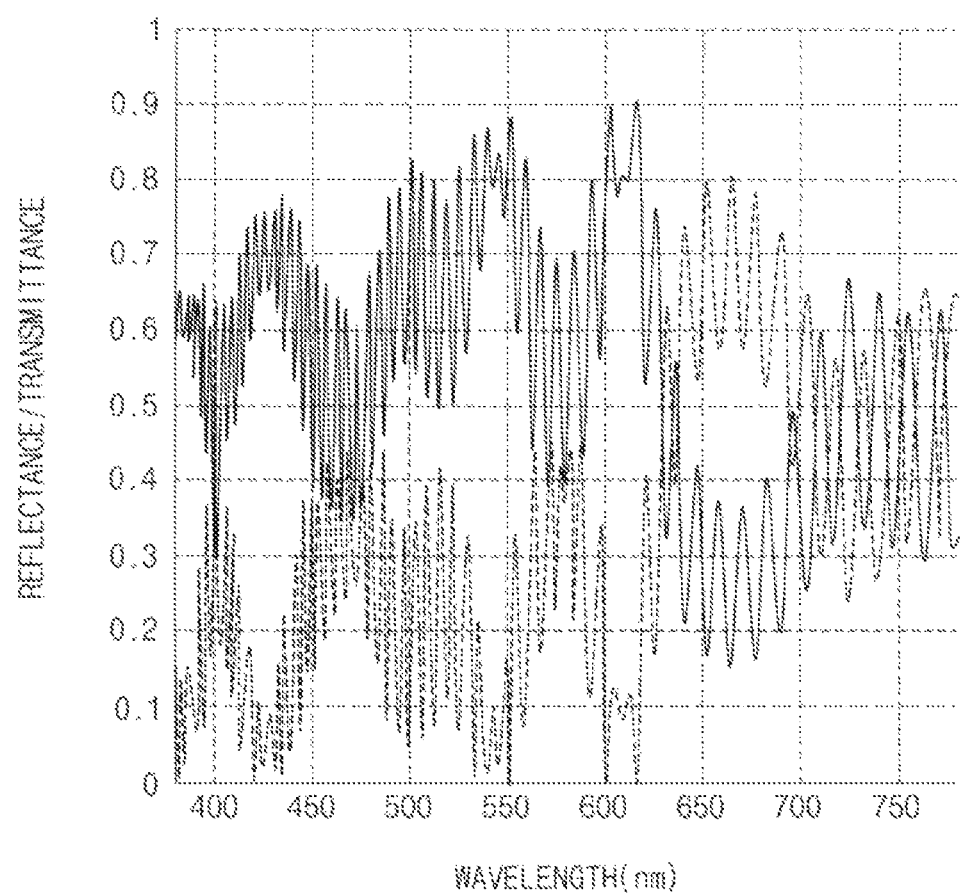

FIGS. 3 and 4 are graphs illustrating an average transmittance of the OLED device of FIG. 1 and an average transmittance of a comparative example.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example: Evaluation on Transmittances Varying Insulation Layer Structures A barrier layer, a buffer layer, a first gate insulation layer, a second gate insulation layer, and a first insulating interlayer, each of which included stacked silicon oxide layer and silicon nitride layer were sequentially formed on a polyimide substrate having a thickness of 10 micrometers to obtain stacked structures of Comparative Example (refer to FIG. 4).

A barrier layer having a single composition of silicon oxynitride, a buffer layer having a single composition of silicon oxide, a first gate insulation layer having a single composition of silicon oxide, a second gate insulation layer having a single composition of silicon oxynitride, and a first insulating interlayer having a single composition of silicon oxynitride were sequentially formed on the polyimide substrate to obtain a stacked structure of Example (refer to FIG. 3).

Specific structures of Comparative Example and Example are shown in Table 1 below. In Table 1, the silicon oxide layer, the silicon nitride layer, and a silicon oxynitride layer are abbreviated as an oxide, a nitride, and an oxynitride, respectively.

TABLE 1

| | Barrier Layer | Buffer Layer | Fist Gate Insulation Layer/Second Gate Insulation Layer | First Insulating Interlayer |
|---|---|---|---|---|
| Comparative Example (FIG. 4) | oxide (1,500 Å)/ nitride (600 Å)/ oxide (1,500 Å)/ nitride (600 Å)/ oxide (1,500 Å) | nitride (1,000 Å)/ oxide (3,000 Å) | oxide (750 Å)/ nitride (400 Å) | oxide (3,000 Å)/ nitride (2,000 Å) |
| Example (FIG. 3) | oxynitride (5,600 Å) | oxide (3,000 Å) | oxide (3000 Å)/ oxynitride (400 Å) | oxynitride (5,000 Å) |

A light was irradiated over each stacked structures of Comparative Example and Example, and transmittances were measured. The measured values are shown in Table 2 below.

TABLE 2

| | Comparative Example (FIG. 4) | Example (FIG. 3) |
|---|---|---|
| Average Transmittance | 64.6% | 83% |

As shown in Table 2, when the stacked structure having a barrier layer having a single composition of silicon oxynitride, a buffer layer having a single composition of silicon oxide, a first gate insulation layer having a single composition of silicon oxide, a second gate insulation layer having a single composition of silicon oxynitride, and a first insulating interlayer having a single composition of silicon oxynitride was formed, the transmittance was drastically increased compared to those measured in Comparative Example, having repeatedly stacked different insulation layers.

FIGS. 5, 6, 7, 8, 9, and 10 are cross-sectional views illustrating a method of manufacturing a display device in accordance with example embodiments.

Figure 5:
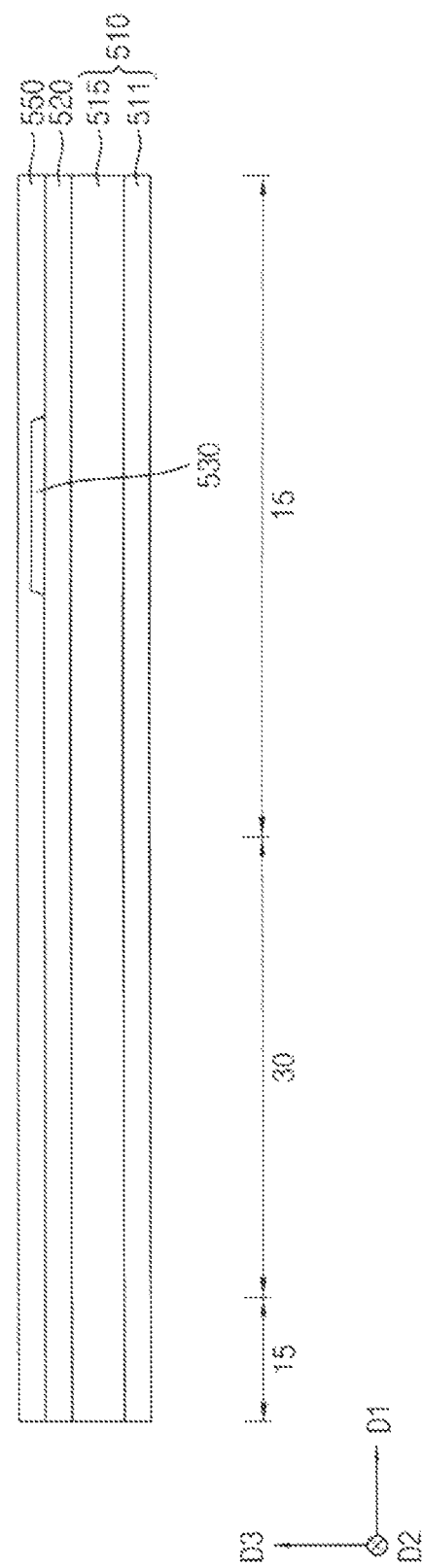
FIG. 5, FIG. 6, FIG. 7, FIG. 8, FIG. 9, and FIG. 10 are cross-sectional views illustrating a method of manufacturing a display device in accordance with example embodiments.

Referring to FIG. 5, a substrate 510 including transparent insulation material(s) may be provided. In example embodiments, the substrate 510 may consist essentially of transparent polyimide substrate. The transparent polyimide substrate may be formed using a flexible transparent resin substrate. In this case, the transparent polyimide substrate may include a polyimide layer 511 and a barrier layer 515. For example, the transparent polyimide substrate may have a structure that the polyimide layer 511 and the barrier layer 515 are stacked on a rigid glass substrate. In a manufacturing an OLED device, after a buffer layer 520 is formed on the barrier layer 515 of the transparent polyimide substrate, a semiconductor element (e.g., switching element) and a pixel structure may be formed on the buffer layer 520. After the semiconductor element and the pixel structure are formed, the rigid glass substrate may be removed. It may be difficult to directly form the semiconductor element and the pixel structure on the transparent polyimide substrate because the transparent polyimide substrate is relatively thin and flexible. In embodiments, the semiconductor element and the pixel structure are formed on the transparent polyimide substrate using the rigid glass substrate, and then the transparent polyimide substrate including the polyimide layer 511 and the barrier layer 515 may serve as the substrate 510 of the OLED device after the removal of the rigid glass substrate. As the OLED device includes a sub-pixel region 15 and a transparent region 30, the substrate 510 may also include the sub-pixel region 15 and the transparent region 30.

In example embodiments, a refractive index of the polyimide layer 511 may be in a range from 1.7 to 1.8. The polyimide layer 511 may be formed using random copolymer or block copolymer. In addition, the polyimide layer 511 may have a high transparency, a low coefficient of thermal expansion, and a high glass transition temperature. Since the polyimide layer 511 includes an imide radical, a heat resistance, a chemical resistance, a wear resistance, and an electrical characteristics may be excellent.

The barrier layer 515 may consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88. In embodiments, the barrier layer 515 may have a substantially single composition of SiOxNy. The barrier layer 515 may block moisture or water capable of being permeated via the polyimide layer 511. In this way, the polyimide layer 511 and the barrier layer 515 may have substantially the same refractive index (value).

The buffer layer 520 may be formed on the substrate 510. The buffer layer 520 may consist essentially of SiOx that has a refractive index in a range from 1.4 to 1.5. In embodiments, the buffer layer 520 may have a substantially single composition of SiOx. The buffer layer 520 may be formed on the entire substrate 510. The buffer layer 520 may prevent the diffusion of metal atoms and/or impurities from the substrate 510 into a switching element and a pixel structure. Additionally, the buffer layer 520 may control a rate of a heat transfer in a crystallization process for forming an active layer 530, thereby obtaining a substantially uniform active layer 530. Furthermore, the buffer layer 520 may improve a surface flatness of the substrate 510 when a surface of the substrate 510 is relatively irregular. Further, as the buffer layer 520 is formed on the substrate 510, the stress generated from the pixel structure formed on the substrate 510 may be reduced.

The active layer 530 may be formed in the sub-pixel region 15 on the buffer layer 520. The active layer 530 may be formed using amorphous silicon or polysilicon.

A first gate insulation layer 550 may be formed on the active layer 530. The first gate insulation layer 550 may consist essentially of SiOx that has a refractive index in a range from 1.4 to 1.5. In embodiments, the first gate insulation layer 550 may have a substantially single composition of SiOx. In addition, the buffer layer 520 and the first gate insulation layer 550 may have substantially the same refractive index (value). The first gate insulation layer 550 may extend in a first direction D1 (e.g., a direction that is parallel to an upper surface of the substrate 510) on the buffer layer 520. The first gate insulation layer 550 may cover the active layer 530 in the sub-pixel region 15, and may be formed on the entire buffer layer 520. For example, the first gate insulation layer 550 may sufficiently cover the active layer 530, and may have a substantially even surface without a step around the active layer 530. In an embodiment, the first gate insulation layer 550 may cover the active layer 530, and may be formed as a substantially uniform thickness along a profile of the active layer 530. In example embodiments, interface characteristics of the active layer 530 may be increased because an upper surface of the active layer 530 including amorphous silicon or polysilicon is in contact with the first gate insulation layer 550 including SiOx and a lower surface of the active layer 530 including amorphous silicon or polysilicon is in contact with the buffer layer 520 including SiOx.

Figure 6:
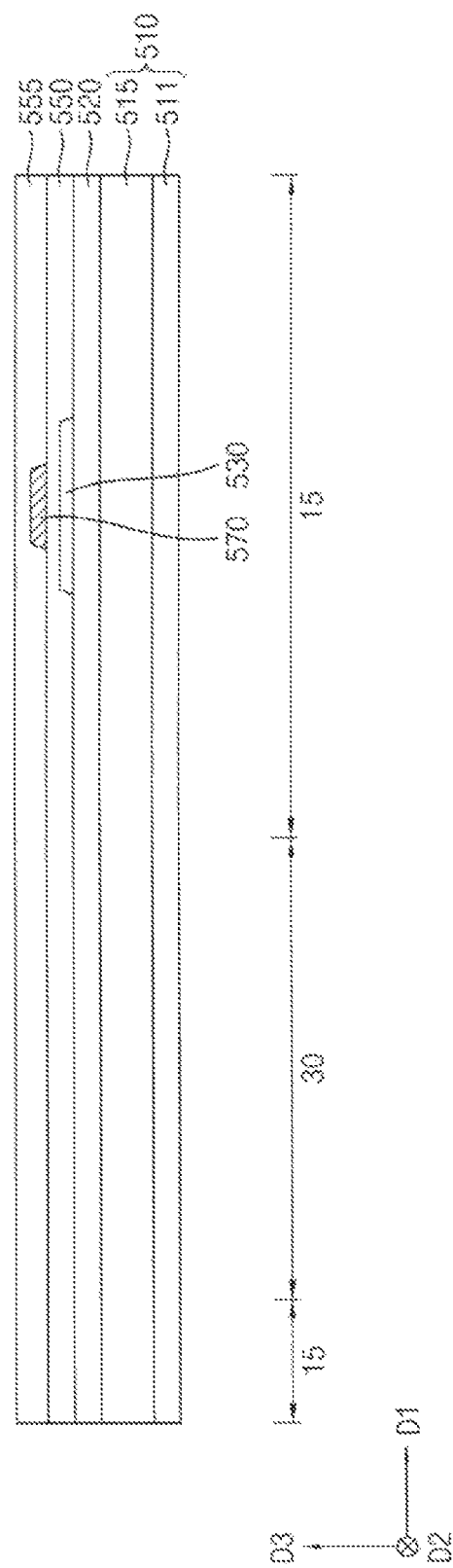

Referring to FIG. 6, a first gate electrode 570 may be formed on the first gate insulation layer 550 under which the active layer 530 is located. The first gate electrode 570 may be formed using a metal, a metal alloy, metal nitride, conductive metal oxide, transparent conductive material(s), etc. For example, the first gate electrode 570 may include one or more of Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof.

A second gate insulation layer 555 may be formed on the first gate electrode 570. The second gate insulation layer 555 may consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88. In embodiments, the second gate insulation layer 555 may have a substantially single composition of SiOxNy.

A second gate insulation layer 555 may be formed on the first gate electrode 570. The second gate insulation layer 555 may include consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88. In embodiments, the second gate insulation layer 555 may have a substantially single composition of SiOxNy.

In addition, the substrate 510 and the second gate insulation layer 555 may have substantially the same refractive index (value). As the second gate insulation layer 555 including SiOxNy is formed, desirable interface characteristics of the active layer 530 may be attained. For example, hydrogen may be injected in a process annealing the active layer 530. The hydrogen may combine with a dangling bond of the active layer 530. The second gate insulation layer 555 may support the hydrogen combination process. Accordingly, desirable interface characteristics of the active layer 530 may be attained, and a mean free path of electrons included in the active layer 530 may be desirable. That is, mobility of electron may be enhanced. The second gate insulation layer 555 may extend in the first direction D1 on the substrate 510. The second gate insulation layer 555 may cover the first gate electrode 570 in the sub-pixel region 15, and may be formed on the entire first gate insulation layer 550. For example, the second gate insulation layer 555 may sufficiently cover the first gate electrode 570, and may have a substantially even surface without a step around the first gate electrode 570. In an embodiment, the second gate insulation layer 555 may cover the first gate electrode 570, and may be formed as a substantially uniform thickness along a profile of the first gate electrode 570.

Figure 7:
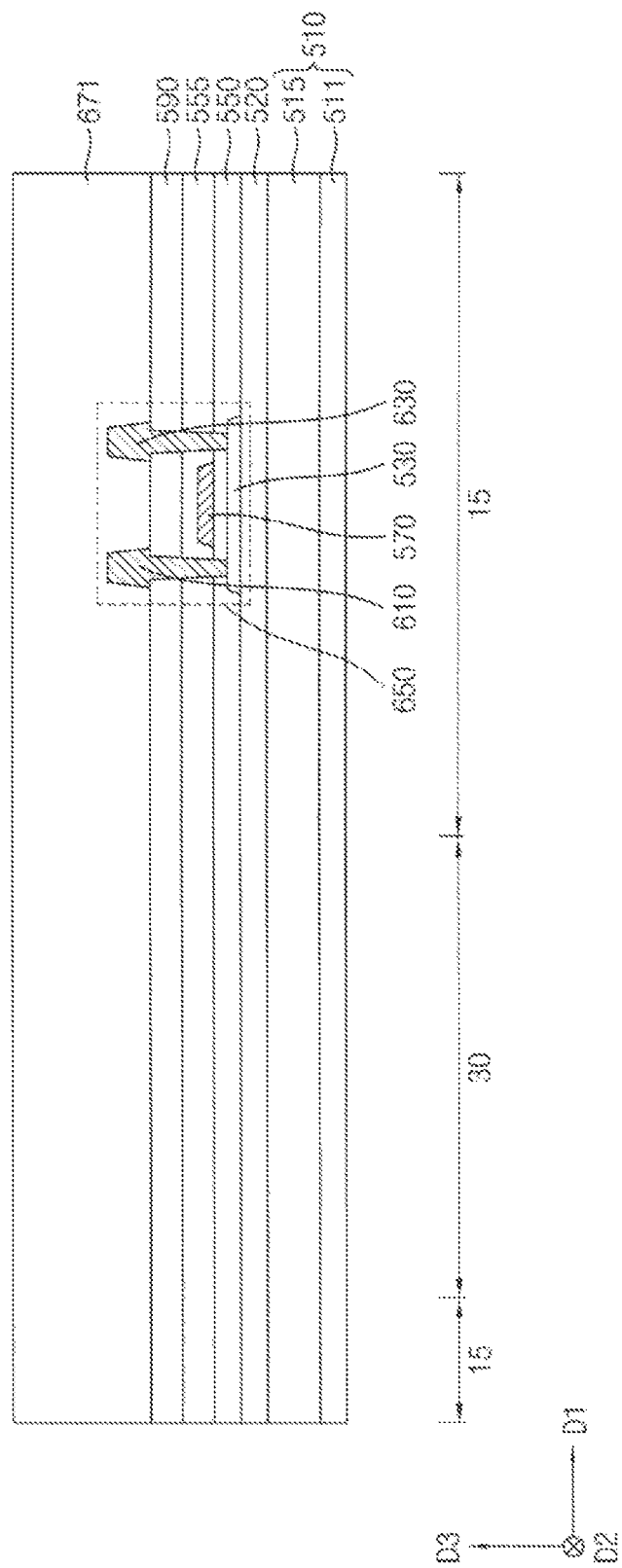

Referring to FIG. 7, a first insulating interlayer 590 may be formed on the second gate insulation layer 555. The first insulating interlayer 590 may consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. Accordingly, the first insulating interlayer 590 may have a substantially single composition of SiOxNy. In addition, the first insulating interlayer 590, the substrate 510 and the second gate insulation layer 555 may have substantially the same refractive index (value). Accordingly, as the substrate 510, the second gate insulation layer 555, and the first insulating interlayer 590 have substantially the same refractive index (value), a transmittance in the transparent region 30 of the OLED device may be increased. The first insulating interlayer 590 may extend in the first direction D1 on the second gate insulation layer 555.

A source electrode 610 and a drain electrode 630 may be formed on the first insulating interlayer 590. The source electrode 610 may be in contact with a source region of the active layer 530 perforating a contact hole formed by removing a portion of the first insulating interlayer 590, the second gate insulation layer 555, and the first gate insulation layer 550 each. The drain electrode 630 may be in contact with a drain region of the active layer 530 perforating a contact hole formed by removing a portion of the first insulating interlayer 590, the second gate insulation layer 555, and the first gate insulation layer 550 each. Each of the source electrode 610 and the drain electrode 630 may be formed using a metal, an alloy, metal nitride, conductive metal oxide, transparent conductive material(s), etc. These may be used alone or in a suitable combination thereof. Accordingly, a switching element 650 including the active layer 530, the first gate electrode 570, the source electrode 610, and the drain electrode 630 may be formed.

A preliminary planarization layer 671 may be formed on the source electrode 610 and the drain electrode 630. The preliminary planarization layer 671 may extend in the first direction D1 on the first insulating interlayer 590. The preliminary planarization layer 671 may cover the source electrode 610 and the drain electrode 630 in the sub-pixel region 15. For example, the preliminary planarization layer 671 may be formed as a relatively high thickness to sufficiently cover the source electrode 610 and the drain electrode 630. In this case, the preliminary planarization layer 671 may have a substantially even upper surface, and a planarization process may be further performed on the preliminary planarization layer 671 to implement the even upper surface of the preliminary planarization layer 671. The preliminary planarization layer 671 may be formed using organic material(s) or inorganic material(s).

Figure 8:
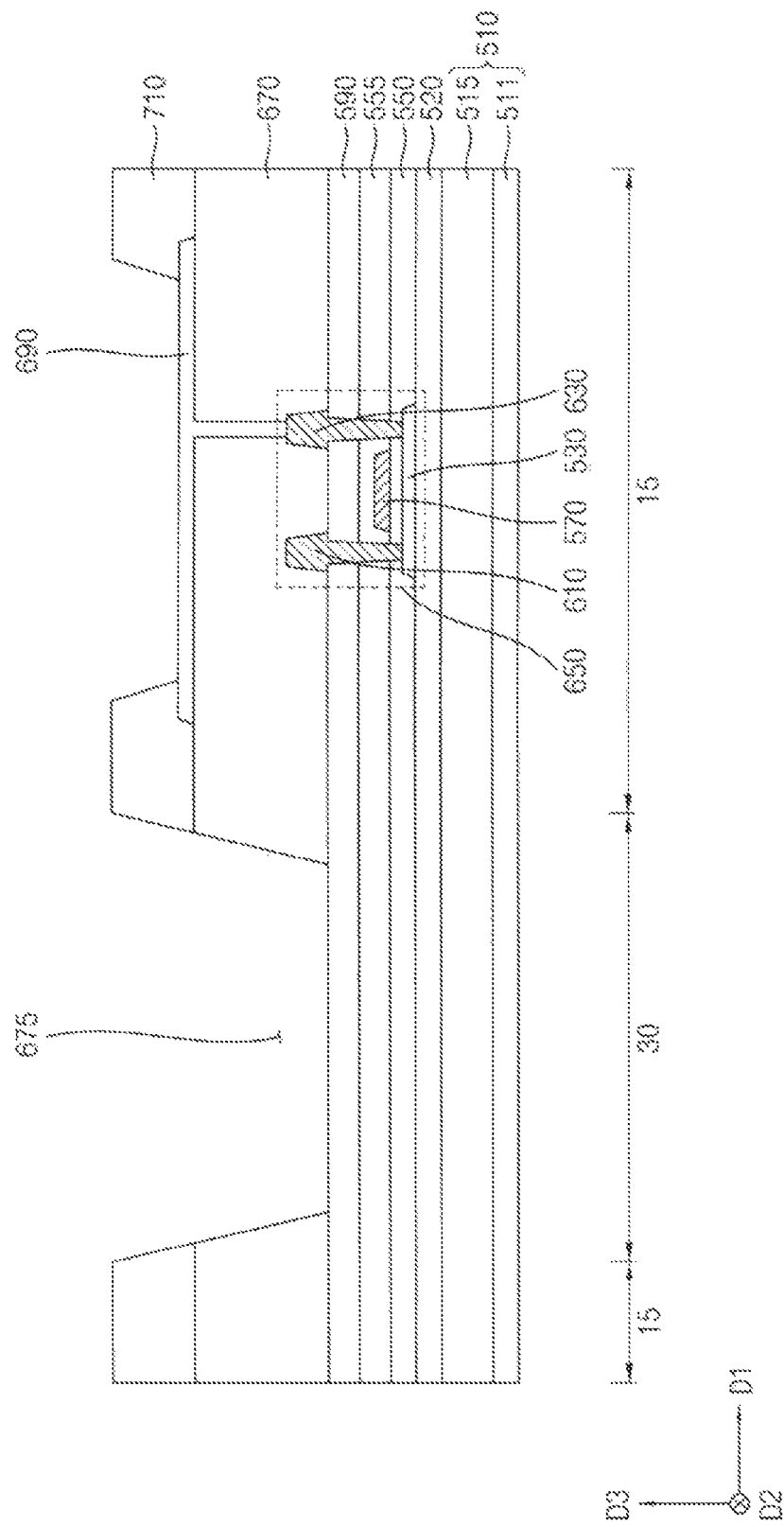

Referring to FIG. 8, a planarization layer 670 may be formed after an opening 675 exposing the first insulating interlayer 590 in the transparent region 30 and a contact hole exposing the drain electrode 630 in the sub-pixel region 15 are formed in the preliminary planarization layer 671.

The first electrode 690 may be formed in the sub-pixel region 15 on the planarization layer 670. The first electrode 690 may be in contact with the drain electrode 630 perforating the contact hole formed by removing a portion of the planarization layer 670. The first electrode 690 may be formed using a metal, a metal alloy, metal nitride, conductive metal oxide, transparent conductive material(s), etc. These may be used alone or in a suitable combination thereof.

A pixel defining layer 710 may expose at least a portion of the first electrode 690, and then may be formed on the planarization layer 670. For example, the pixel defining layer 710 may cover both lateral portions of the first electrode 690, and may expose the opening 675 of the planarization layer 670. The pixel defining layer 710 may be formed using inorganic material(s) or organic material(s).

Figure 9:
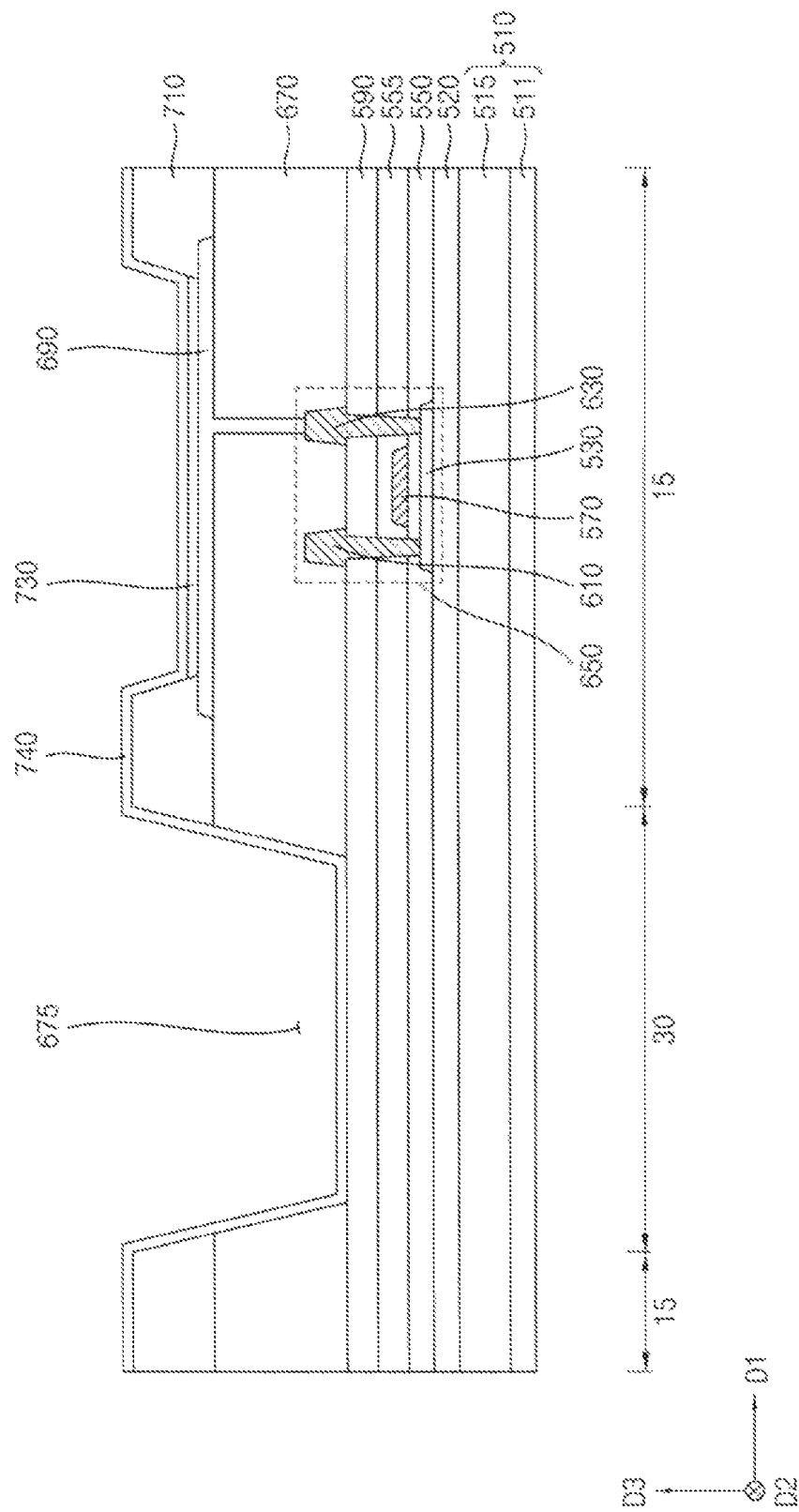

Referring to FIG. 9, a light emitting layer 730 may be formed on a portion of the first electrode 690 that is exposed by the pixel defining layer 710. The light emitting layer 730 may have a multi-layered structure including EL, HIL, HTL, ETL, EIL, etc. The EL of the light emitting layer 730 may be formed using at least one of light emitting material(s) capable of generating at least one of different colors of light (e.g., a red color of light, a blue color of light, and a green color of light, etc.) according to first, second, and third sub-pixels illustrated in FIG. 1. In an embodiment, the EL of the light emitting layer 730 may generally generate a white color of light by stacking a plurality of light emitting material(s) capable of generating different colors of light such as a red color of light, a green color of light, a blue color of light, etc. In some example embodiments, the HIL, the HTL, the ETL, the EIL, etc. except the EL may be formed in the transparent region 30 on the first insulating interlayer 590.

A second electrode 740 may be formed on the pixel defining layer 710, the light emitting layer 730, a portion of the planarization layer 670, and a portion of the first insulating interlayer 590. The second electrode 740 may cover the pixel defining layer 710, the first insulating interlayer 590, the planarization layer 670, and the light emitting layer 730 in the sub-pixel region 15 and the transparent region 30. The second electrode 740 may be formed using a metal, a metal alloy, metal nitride, conductive metal oxide, transparent conductive material(s), etc. Accordingly, the pixel structure may be formed.

Figure 10:
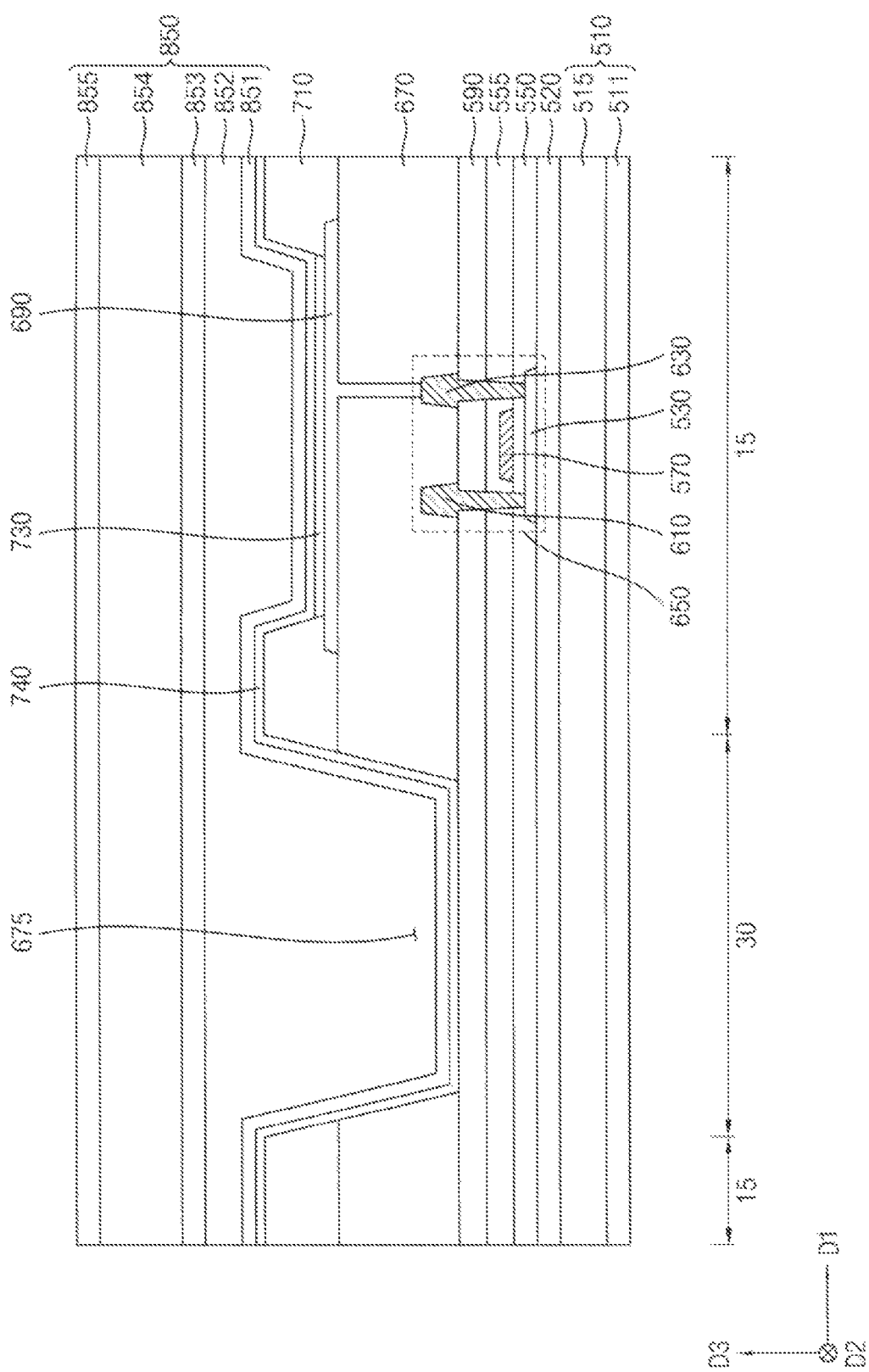

Referring to FIG. 10, a thin film encapsulation structure 850 may be formed on the second electrode 740. The thin film encapsulation structure 850 may include at least one first encapsulation layer and at least one second encapsulation layer. For example, a second encapsulation layer 852 may be formed on a first encapsulation layer 851. The first encapsulation layers and the second encapsulation layers may be alternately and repeatedly arranged. The first encapsulation layer 851 may cover the second electrode 740, and may be formed as a substantially uniform thickness along a profile of the second electrode 740. The first encapsulation layer 851 may prevent the pixel structure form being deteriorated by the permeation of moisture, water, oxygen, etc. In addition, the first encapsulation layer 851 may protect the pixel structure from external impacts. The first encapsulation layer 851 may be formed using inorganic material(s).

The second encapsulation layer 852 may be formed on the first encapsulation layer 851. The second encapsulation layer 852 may improve a surface flatness of the OLED device, and may protect the pixel structure formed in the sub-pixel region 15. The second encapsulation layer 852 may be formed using organic material(s).

The first encapsulation layer 853 may be formed on the second encapsulation layer 852. The first encapsulation layer 853 may cover the second encapsulation layer 852, and may be formed as a substantially uniform thickness along a profile of the second encapsulation layer 852. The first encapsulation layer 853 together with the first encapsulation layer 851 and the second encapsulation layer 852 may prevent the pixel structure form being deteriorated by the permeation of moisture, water, oxygen, etc. In addition, the first encapsulation layer 853 together with the first encapsulation layer 851 and the second encapsulation layer 852 may protect the pixel structure from external impacts. The first encapsulation layer 853 may be formed using inorganic material(s).

The second encapsulation layer 854 may be formed on the first encapsulation layer 853. The second encapsulation layer 854 may perform functions substantially the same as or similar to those of the second encapsulation layer 852, and the second encapsulation layer 854 may include a material substantially the same as or similar to that of the second encapsulation layer 852. The first encapsulation layer 855 may be formed on the second encapsulation layer 854. The first encapsulation layer 855 may perform functions substantially the same as or similar to those of the first encapsulation layers 851 and 853, and the first encapsulation layer 855 may include a material substantially the same as or similar to that of the first encapsulation layers 851 and 853. Accordingly, the OLED device 100 illustrated in FIG. 2A may be manufactured.

Figure 11:
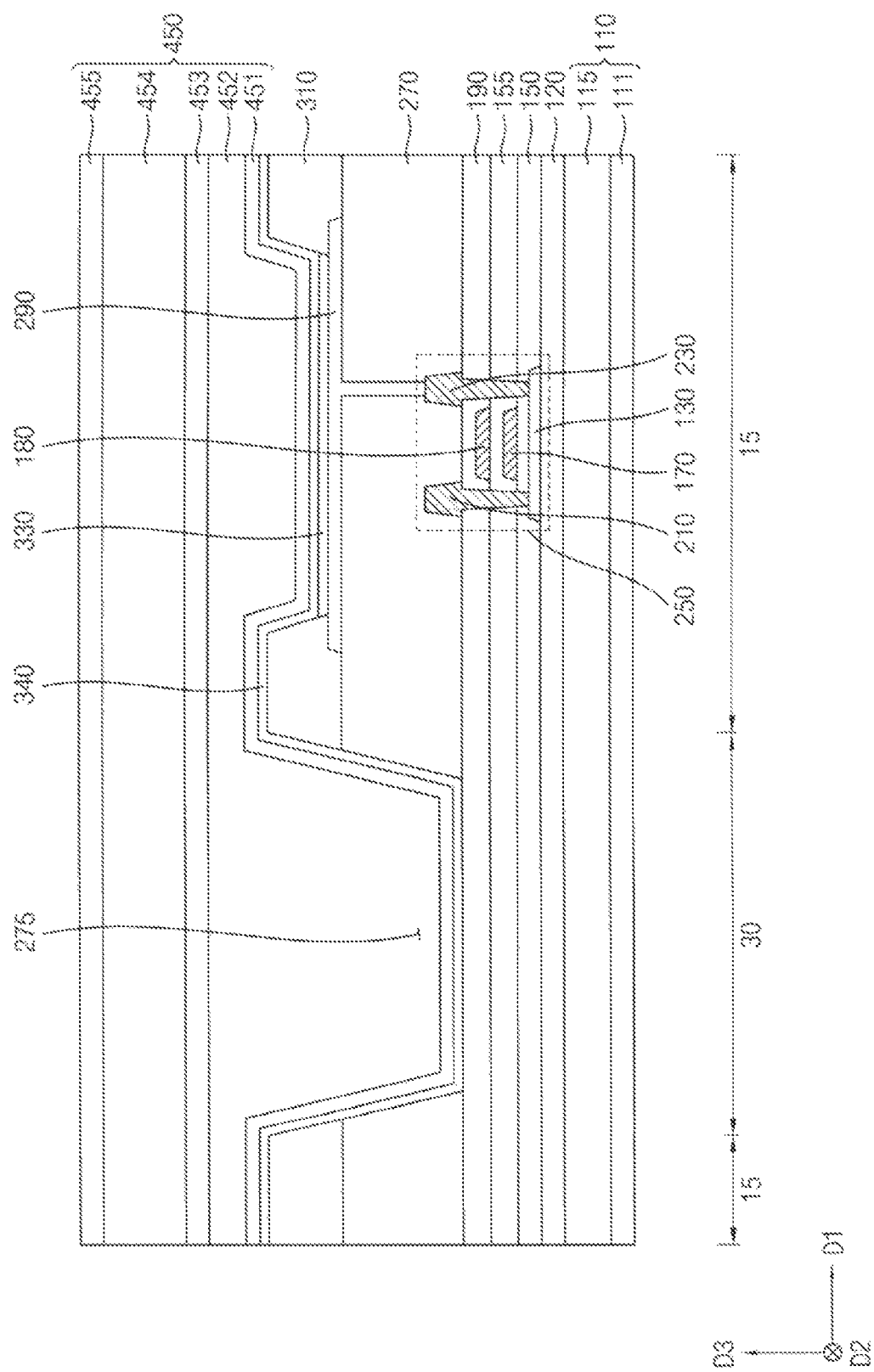
FIG. 11 is a cross-sectional view illustrating an OLED device in accordance with example embodiments.
Figure 12:
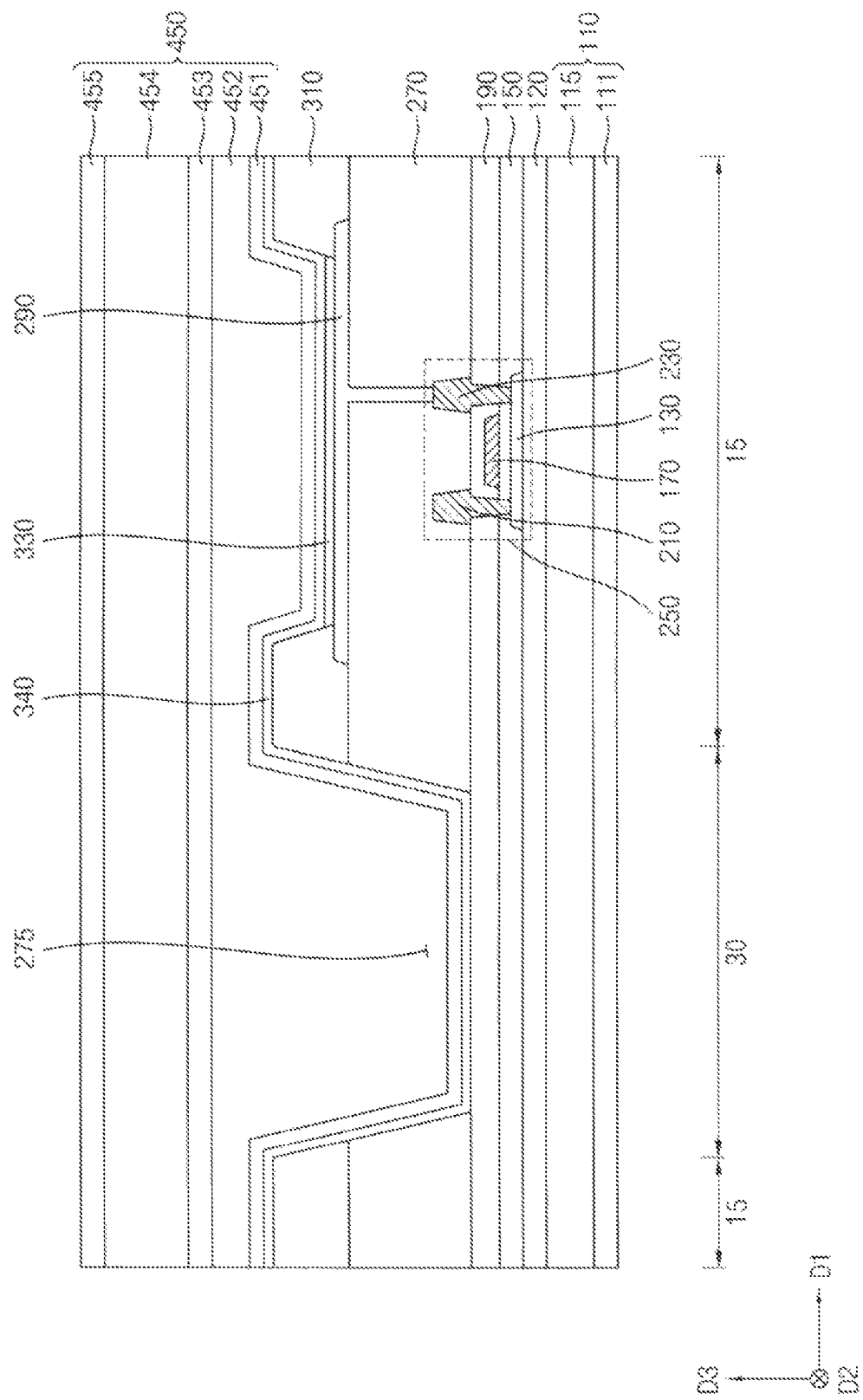
FIG. 12 is a cross-sectional view illustrating an OLED device.

FIG. 11 is a cross-sectional view illustrating an example of the OLED device of FIG. 1, and FIG. 12 is a cross-sectional view illustrating another example of the OLED device of FIG. 1. OLED devices illustrated in FIGS. 11 and 12 may have a configuration substantially the same as or similar to that of an OLED device 100 described with reference to FIG. 2A. Regarding FIGS. 11 and 12, detailed descriptions for elements that are substantially the same as or similar to elements described with reference to FIG. 2A may not be repeated.

Referring to FIG. 11, an OLED device according to example embodiments may further include a second gate electrode 180. The second gate electrode 180 may be interposed between the second gate insulation layer 155 and the first insulating interlayer 190, and may be disposed on the second gate insulation layer 155 under which the first gate electrode 170 is disposed. The first gate electrode 170 and the second gate electrode 180 may serve as a capacitor. The second gate electrode 180 may include one or more of a metal, a metal alloy, metal nitride, conductive metal oxide, transparent conductive material(s), etc.

Referring to FIG. 12, compared to FIG. 2A, the second gate insulation layer 155 disposed on the first gate insulation layer 150 may be omitted. In embodiments, the first gate insulation layer 150 may consist essentially of SiOx that has a refractive index in a range from 1.4 to 1.5. In embodiments, the first gate insulation layer 150 may have a substantially single composition of SiOx. That is, the first insulating interlayer 190 may cover the first gate electrode 170 in the sub-pixel region 15, and may be disposed on the entire first gate insulation layer 150. For example, the first insulating interlayer 190 may sufficiently cover the first gate electrode 170, and may have a substantially even surface without a step around the first gate electrode 170. In an embodiment, the first insulating interlayer 190 may cover the first gate electrode 170, and may be disposed as a substantially uniform thickness along a profile of the first gate electrode 170.

Figure 13A:
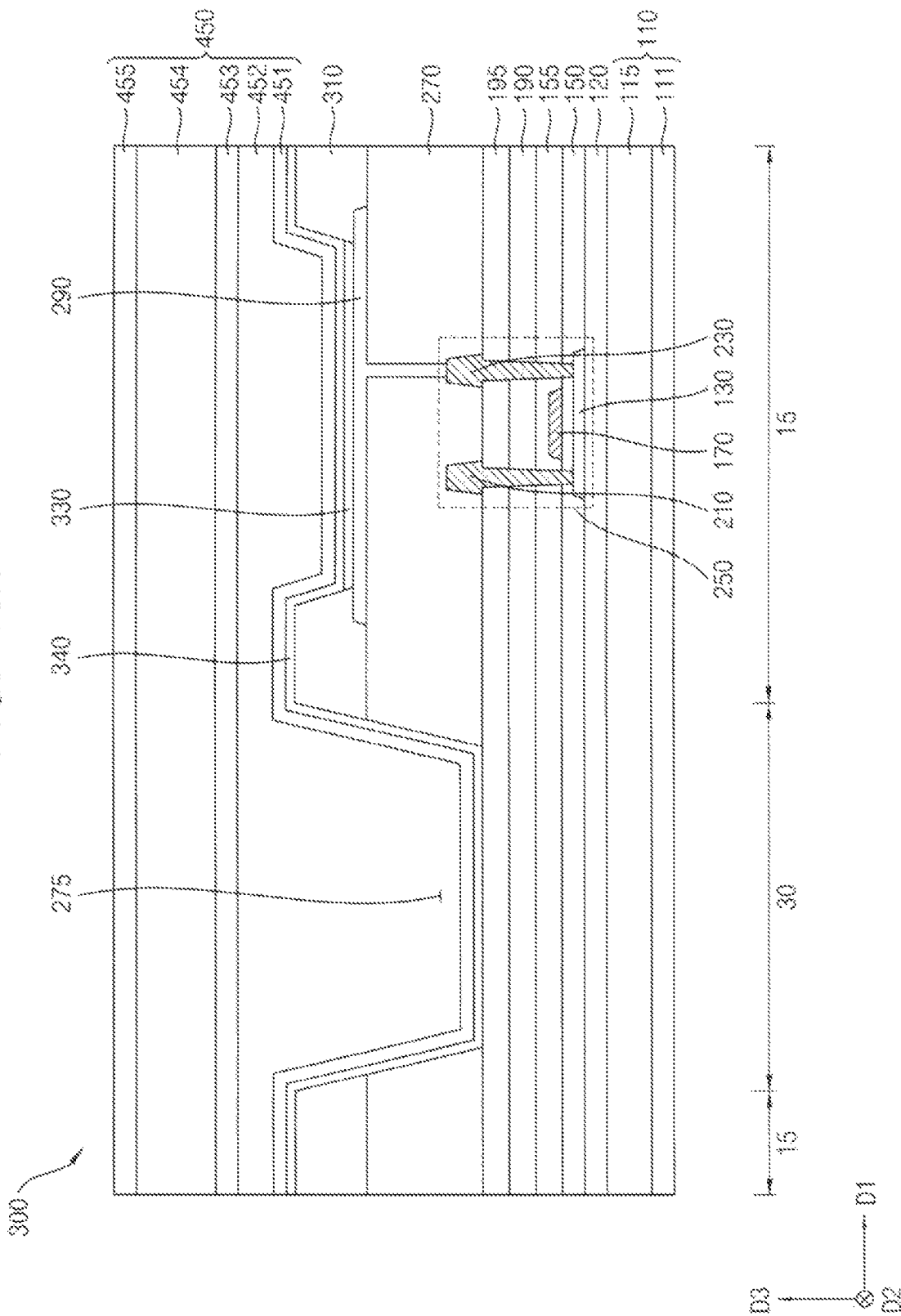
FIG. 13A is a cross-sectional view illustrating an OLED device in accordance with example embodiments.
Figure 13B:
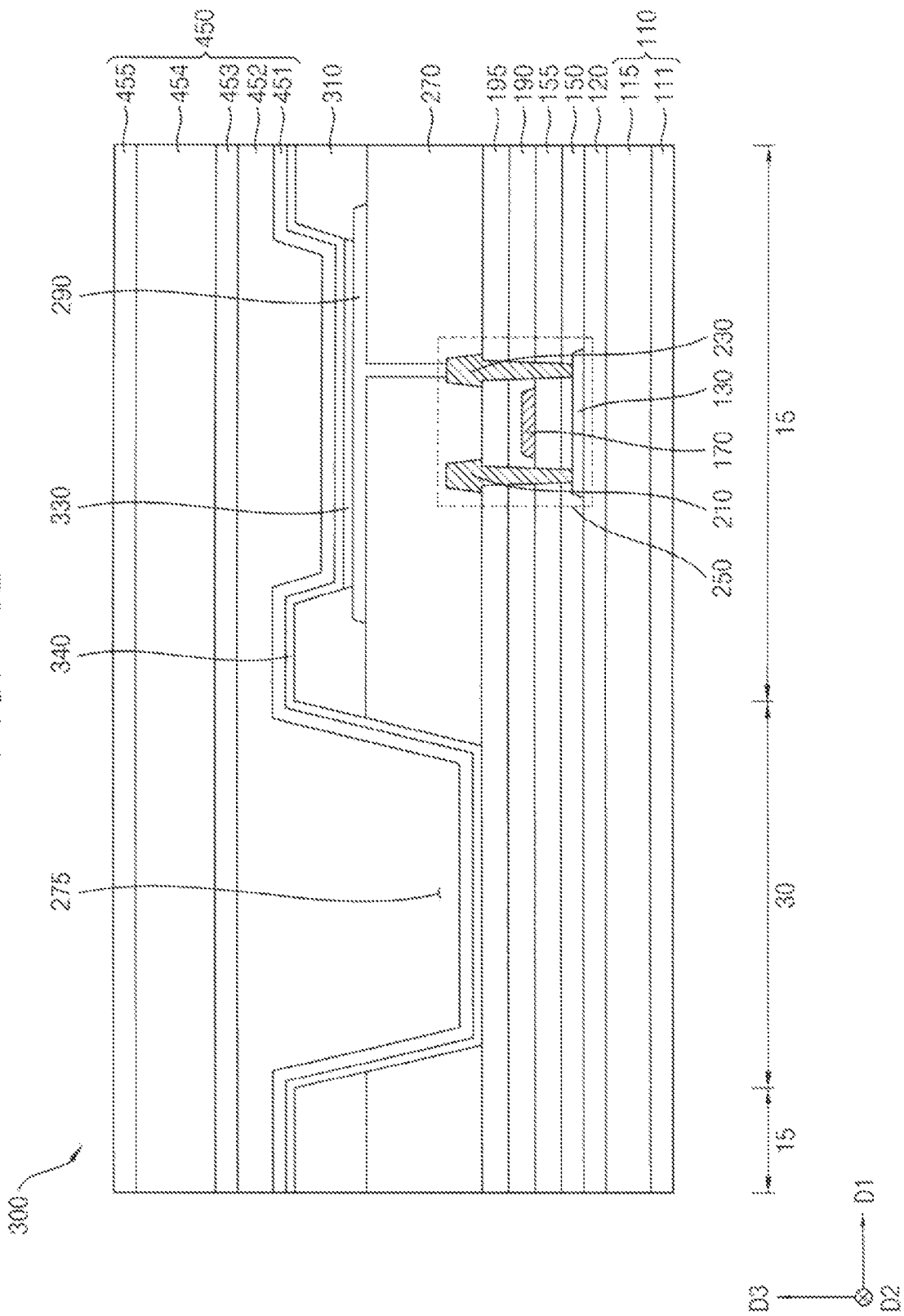
FIG. 13B is a cross-sectional view illustrating an OLED device in accordance with example embodiments.

FIG. 13A is a cross-sectional view illustrating an OLED device in accordance with example embodiments, and FIG. 13B is a cross-sectional view illustrating an OLED device in accordance with example embodiments. An OLED device 300 illustrated in FIG. 13A may have a configuration substantially the same as or similar to that of an OLED device 100 described with reference to FIG. 2A except a second insulating interlayer 195. Regarding FIG. 13A, detailed descriptions for elements that are substantially the same as or similar to elements described with reference to FIG. 2A may not be repeated.

Referring to FIG. 13A, an OLED device 300 may include a substrate 110, a buffer layer 120, a semiconductor element 250 (e.g., a switching element 250), a first gate insulation layer 150, a second gate insulation layer 155, a pixel structure, a first insulating interlayer 190, a second insulating interlayer 195, a planarization layer 270, a pixel defining layer 310, a thin film encapsulation structure 450, etc. Here, the substrate 110 may include a polyimide layer 111 and a barrier layer 115, and the pixel structure may include a first electrode 290, a light emitting layer 330, and a second electrode 340. In addition, the switching element 250 may include an active layer 130, a first gate electrode 170, a source electrode 210, and a drain electrode 230. The thin film encapsulation structure 450 may include first encapsulation layers 451, 453, and 455 and second encapsulation layers 452 and 454.

The first insulating interlayer 190 may be disposed on the second gate insulation layer 155. The first insulating interlayer 190 may include organic material(s) or inorganic material(s) that have a refractive index in a range from 1.7 to 1.8 (e.g., a second refractive index). In example embodiments, the first insulating interlayer 190 may consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88. In embodiments, the first insulating interlayer 190 may have a substantially single composition of SiOxNy.

In example embodiments, the second insulating interlayer 195 may be interposed between the first insulating interlayer 190 and the source and drain electrodes 210 and 230, and may disposed in the sub-pixel region 15 and the transparent region 30 on the first insulating interlayer 190. In addition, the second insulating interlayer 195 may have a refractive index in a range from 1.4 to 1.5 (e.g., a first refractive index).

As the second insulating interlayer 195 having the first refractive index that is less than the second refractive index is disposed on the first insulating interlayer 190 having the second refractive index, a transmittance in the transparent region 30 of the OLED device 300 may be increased. For example, when a light is transmitted from a first layer having a high refractive index into a second layer having a low refractive index, a transmittance of a light may be increased. In embodiments, the OLED device 300 may serve as a transparent flexible OLED device with satisfactory transmittance.

In some example embodiments, as illustrated in FIG. 13B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170.

Figure 14:
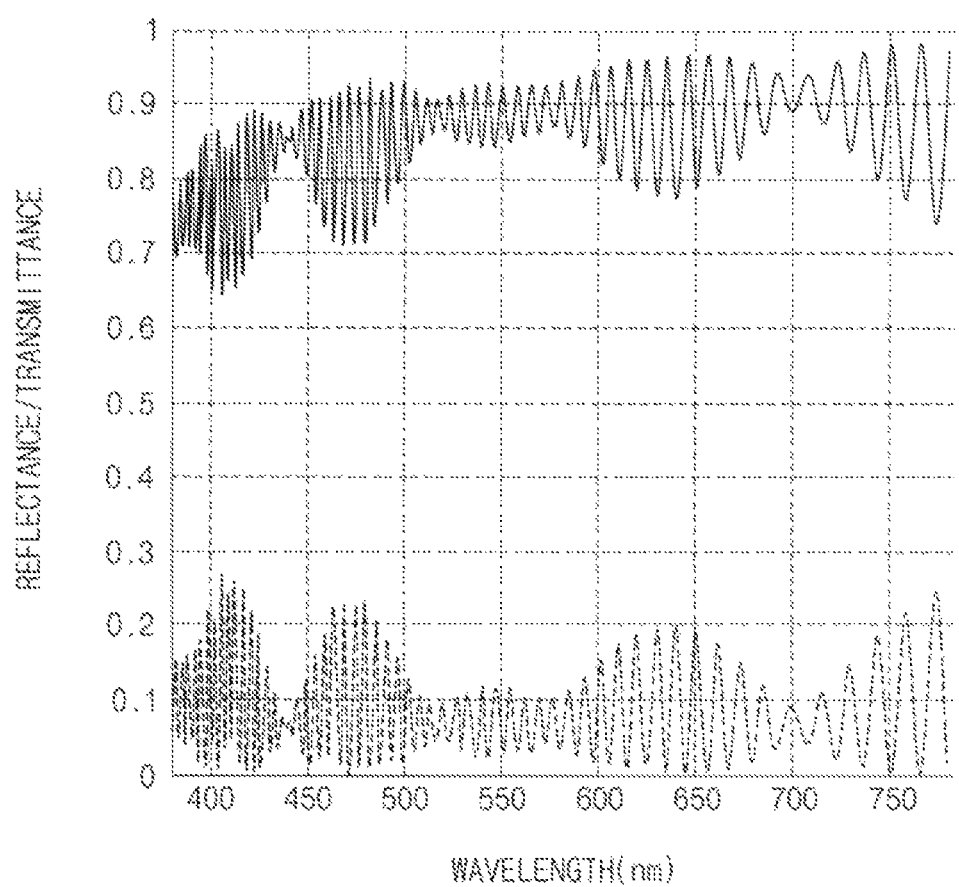
FIG. 14 and FIG. 15 are graphs illustrating an average transmittance of the OLED device of FIG. 13A and an average transmittance of a comparative example.
Figure 15:
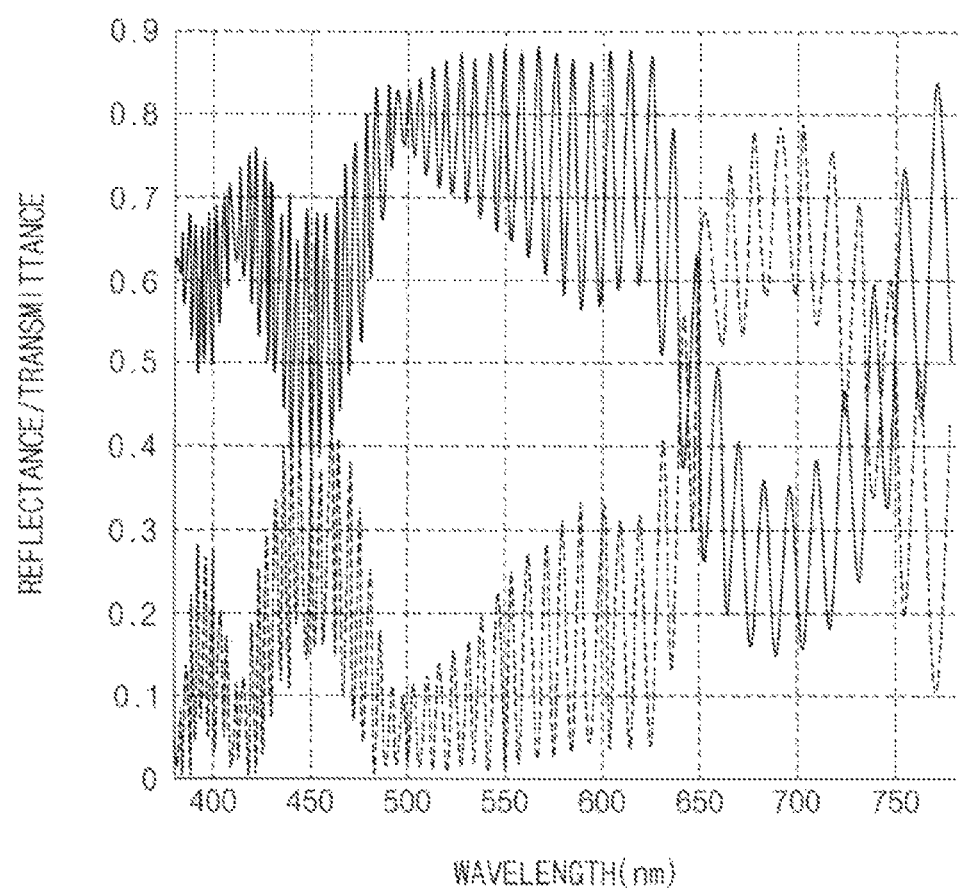

FIGS. 14 and 15 are graphs illustrating an average transmittance of the OLED device of FIG. 13A and an average transmittance of a comparative example.

Experimental Example: Evaluation on Transmittances Varying Insulation Layer Structures A barrier layer, a buffer layer, a first gate insulation layer, a second gate insulation layer, a first insulating interlayer, and a second insulating interlayer, each of which included stacked silicon oxide layer and silicon nitride layer were sequentially formed on a polyimide substrate having a thickness of 10 micrometers to obtain stacked structures of Comparative Example (refer to FIG. 15).

A barrier layer having a single composition of silicon oxynitride, a buffer layer having a single composition of silicon oxide, a first gate insulation layer having a single composition of silicon oxide, a second gate insulation layer having a single composition of silicon oxynitride, a first insulating interlayer having a single composition of silicon oxynitride, and a second insulating interlayer having a single composition of silicon oxide were sequentially formed on the polyimide substrate to obtain a stacked structure of Example (refer to FIG. 14).

Specific structures of Comparative Example and Example are shown in Table 3 below. In Table 3, the silicon oxide layer, the silicon nitride layer, and a silicon oxynitride layer are abbreviated as an oxide, a nitride, and an oxynitride, respectively.

TABLE 3

|  | Barrier Layer | Buffer Layer | Fist Gate Insulation Layer/Second Gate Insulation Layer | First Insulating Interlayer | Second Insulating Interlayer |
| --- | --- | --- | --- | --- | --- |
| Comparative Example (FIG. 15) | oxide (1,500 Å)/ nitride (600 Å)/ oxide (1,500 Å)/ nitride (600 Å)/ oxide (1,500 Å) | nitride (1,000 Å)/ oxide (3,000 Å) | oxide (750 Å)/ nitride (400 Å) | oxide (3,000 Å)/ Nitride (2,000 Å) | oxide (1,000 Å) |
| Example (FIG. 14) | oxynitride (5,600 Å) | oxide (3,000 Å) | oxide (3000 Å)/ Oxynitride (400 Å) | oxynitride (5,000 Å) | oxide (1,000 Å) |

A light was irradiated over each stacked structures of Comparative Example and Example, and transmittances were measured. The measured values are shown in Table 4 below.

TABLE 4

|  | Comparative Example (FIG. 15) | Example (FIG. 14) |
| --- | --- | --- |
| Average Transmittance | 73.25% | 88.2% |

As shown in Table 4, when the stacked structure having a barrier layer having a single composition of silicon oxynitride, a buffer layer having a single composition of silicon oxide, a first gate insulation layer having a single composition of silicon oxide, a second gate insulation layer having a single composition of silicon oxynitride, a first insulating interlayer having a single composition of silicon oxynitride, and a second insulating interlayer having a single composition of silicon oxide was formed, the transmittance was drastically increased compared to those measured in Comparative Example, having repeatedly stacked different insulation layers.

Figure 16A:
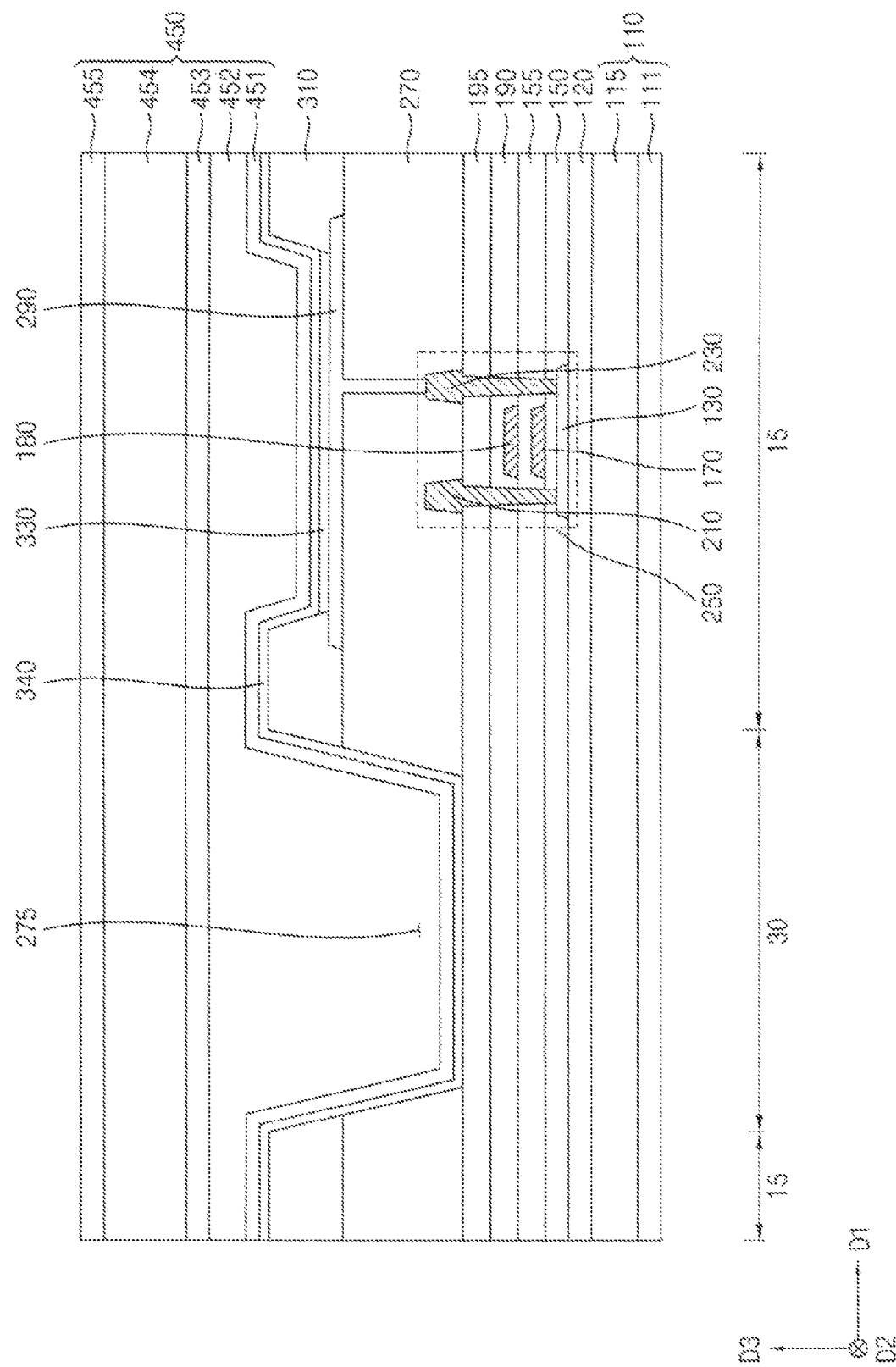
FIG. 16A is a cross-sectional view illustrating an OLED device in accordance with example embodiments.
Figure 17:
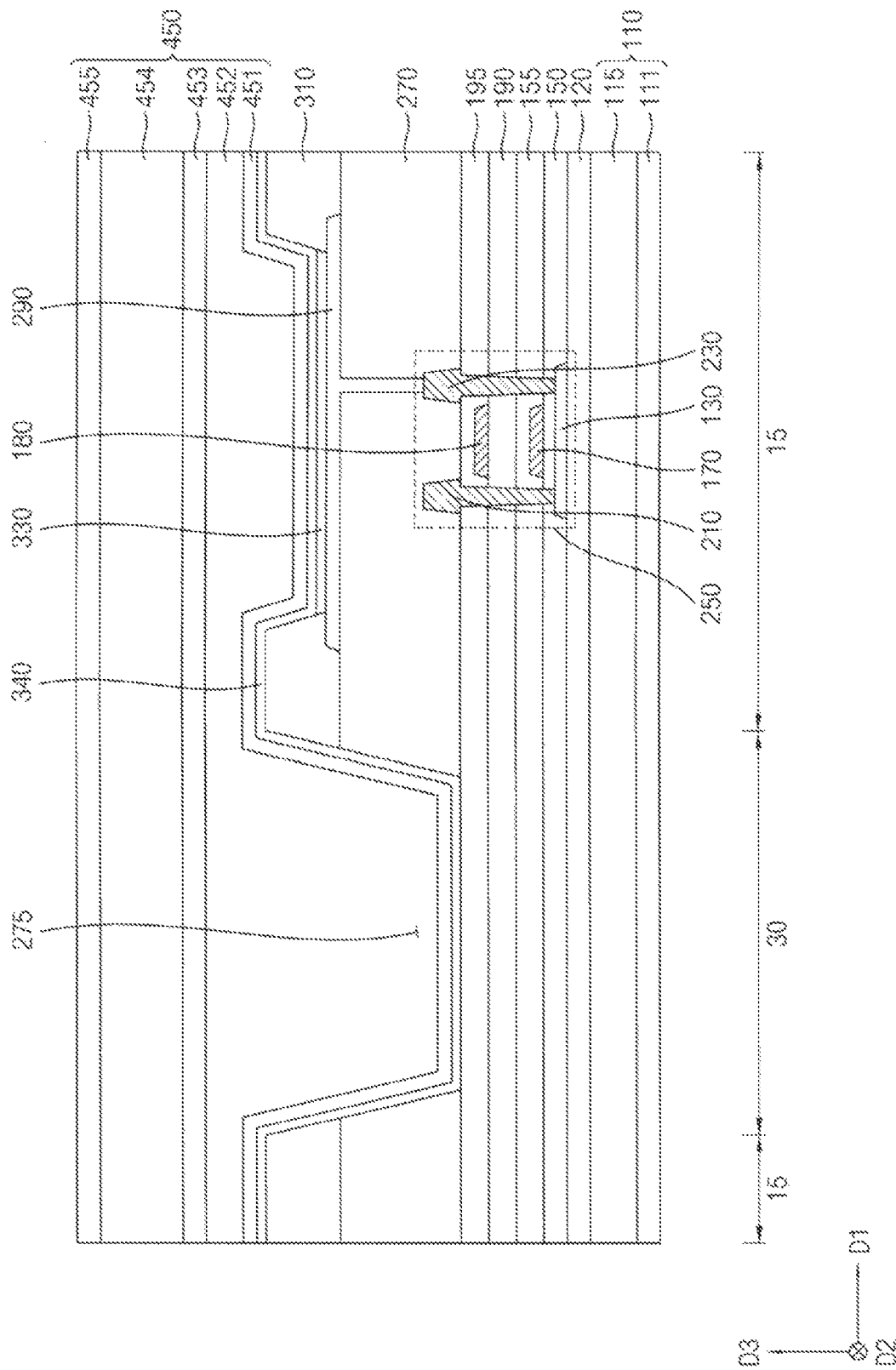
FIG. 17 is a cross-sectional view illustrating an OLED device in accordance with example embodiments.

FIG. 16A is a cross-sectional view illustrating an example of the OLED device of FIG. 13A, and FIG. 17 is a cross-sectional view illustrating another example of the OLED device of FIG. 13A. OLED devices illustrated in FIGS. 16A and 17 may have a configuration substantially the same as or similar to that of an OLED device 300 described with reference to FIG. 13A. Regarding FIGS. 16A and 17, detailed descriptions for elements that are substantially the same as or similar to elements described with reference to FIG. 13A may not be repeated.

Referring to FIGS. 16A and 17, an OLED device according to example embodiments may further include a second gate electrode 180. The second gate electrode 180 may be interposed between the second gate insulation layer 155 and the second insulating interlayer 195. For example, as illustrated in FIG. 16A, the second gate electrode 180 may be disposed on the second gate insulation layer 155 under which the first gate electrode 170 is disposed. In some example embodiments, as illustrated in FIG. 17, the second gate electrode 180 may be disposed on the first insulating interlayer 190 under which the first gate electrode 170 is disposed. The first gate electrode 170 and the second gate electrode 180 may serve as a capacitor. The second gate electrode 180 may include one or more of a metal, a metal alloy, metal nitride, conductive metal oxide, transparent conductive material(s), etc.

Figure 16B:
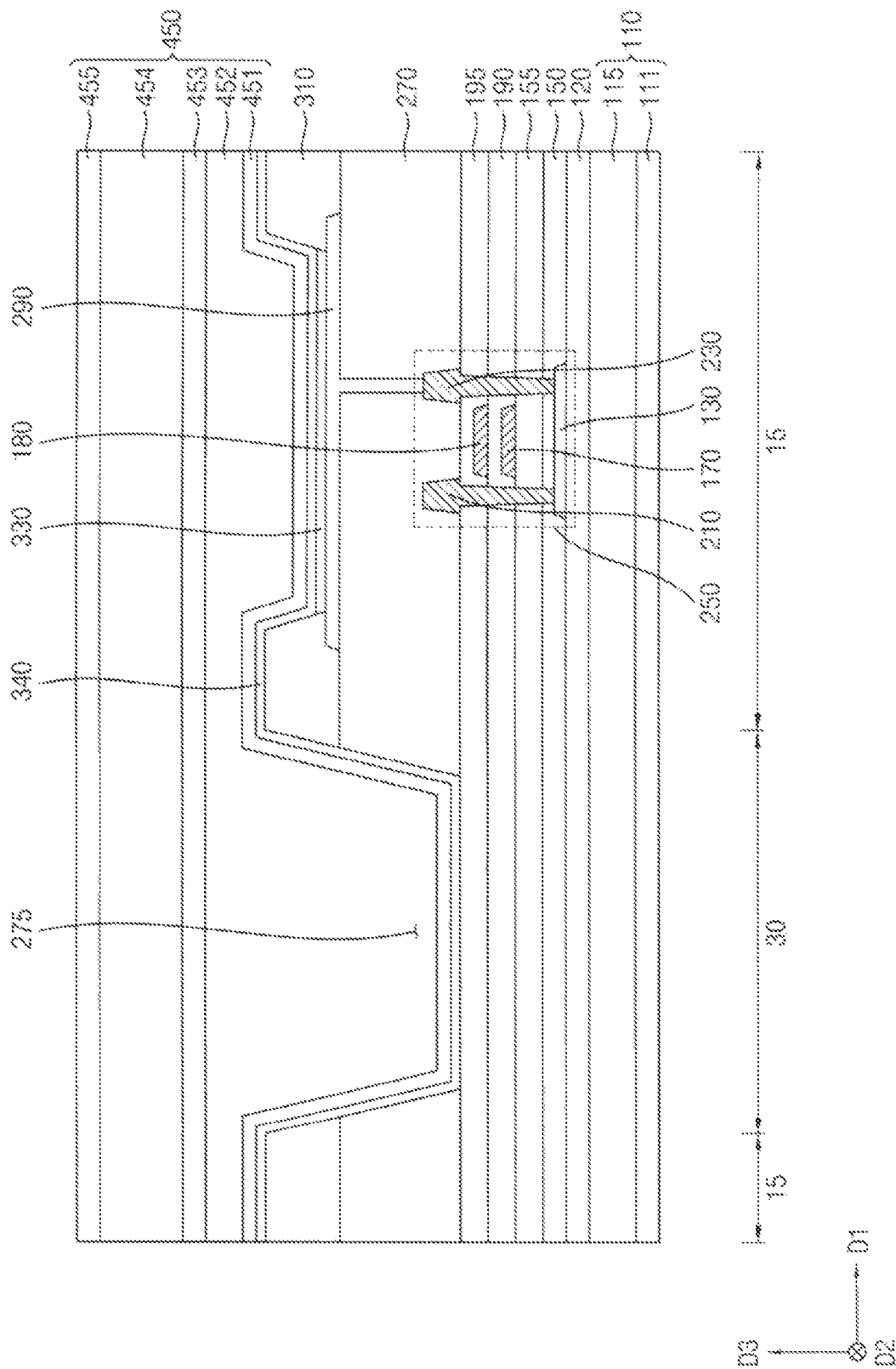
FIG. 16B is a cross-sectional view illustrating an OLED device in accordance with example embodiments.

In some example embodiments, as illustrated in FIG. 16B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170, and the second gate electrode 180 may be interposed between the first insulating interlayer 190 and the second insulating interlayer 195. That is, the second gate electrode 180 may be disposed on the first insulating interlayer 190 under which the first gate electrode 170 is located.

Figure 18A:
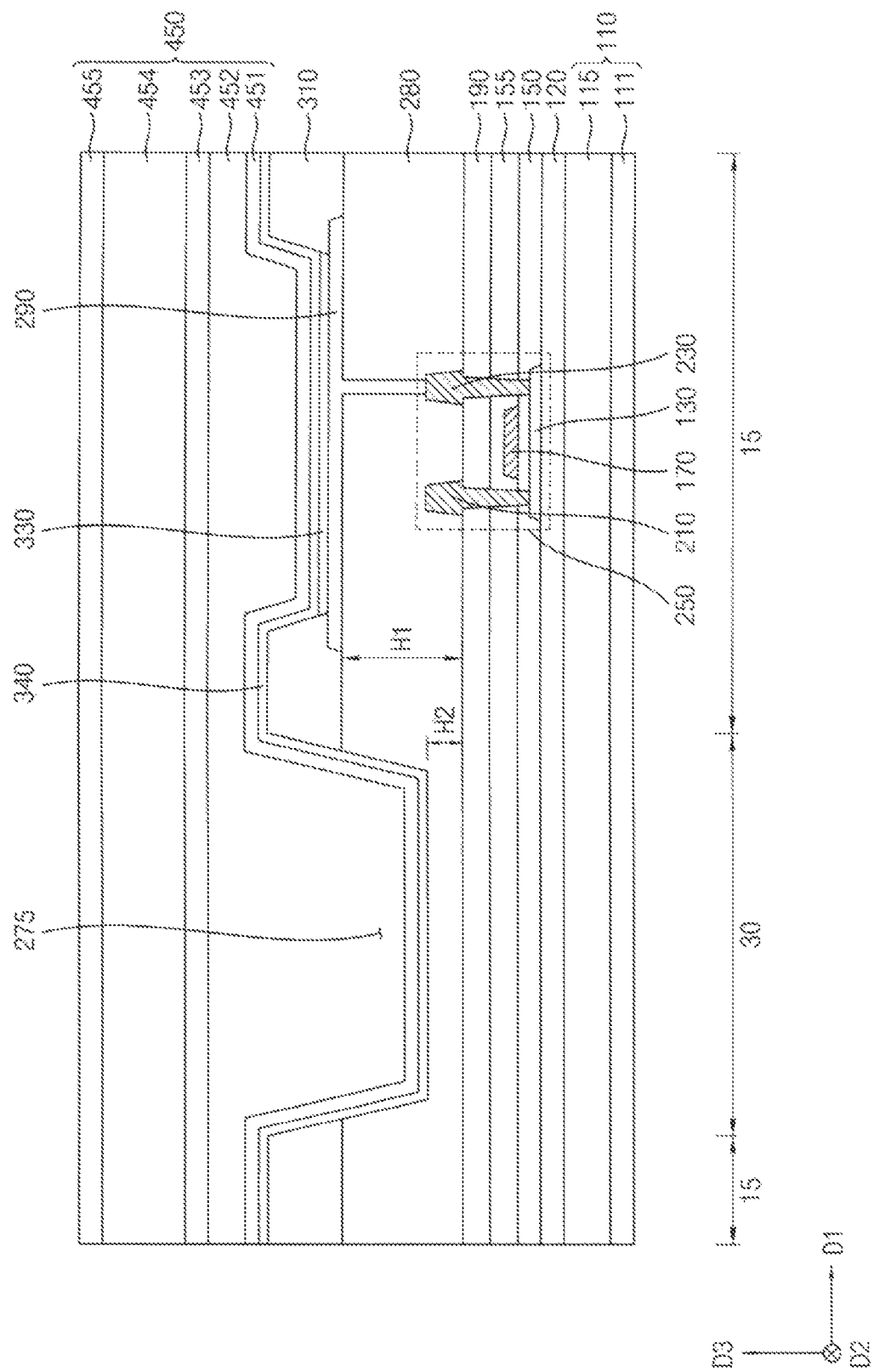
FIG. 18A is a cross-sectional view illustrating an OLED device in accordance with example embodiments.

FIG. 18A is a cross-sectional view illustrating still another example of the OLED device of FIG. 13A. An OLED device illustrated in FIG. 18A may have a configuration substantially the same as or similar to that of an OLED device 300 described with reference to FIG. 13A. Regarding FIG. 18A, detailed descriptions for elements that are substantially the same as or similar to elements described with reference to FIG. 13A may not be repeated.

Referring to FIG. 18A, an OLED device may include a substrate 110, a buffer layer 120, a semiconductor element 250 (e.g., a switching element 250), a first gate insulation layer 150, a second gate insulation layer 155, a pixel structure, a first insulating interlayer 190, a planarization layer 280, a pixel defining layer 310, a thin film encapsulation structure 450, etc. Here, the substrate 110 may include a polyimide layer 111 and a barrier layer 115, and the pixel structure may include a first electrode 290, a light emitting layer 330, and a second electrode 340. In addition, the switching element 250 may include an active layer 130, a first gate electrode 170, a source electrode 210, and a drain electrode 230. The thin film encapsulation structure 450 may include first encapsulation layers 451, 453, and 455 and second encapsulation layers 452 and 454.

Compared to FIG. 13A, the second insulating interlayer 195 disposed on the first insulating interlayer 190 may be omitted.

In example embodiments, the planarization layer 280 may be disposed in the sub-pixel region 15 and the transparent region 30 on the source electrode 210, the drain electrode 230, and the first insulating interlayer 190. The planarization layer 280 may include organic material(s) or inorganic material(s) that have a refractive index in a range from 1.4 to 1.5 (e.g., a first refractive index). The planarization layer 280 may have a first height H1 in the sub-pixel region 15, and the first height H1 may extend in a third direction D3 that is vertical to an upper surface of the substrate 110. The planarization layer 280 may have a second height H2 in the transparent region 30, and the second height H2 extending in the third direction D3 may be less than the first height H1. As the planarization layer 280 having the second height H2 and the first refractive index in the transparent region 30 is disposed, the second insulating interlayer may be omitted. That is, the planarization layer 280 having the second height H2 and the first refractive index may serve as the second insulating interlayer 195 of FIG. 13A. Accordingly, a thickness of the OLED device may be minimized, and manufacturing cost of the OLED device may be minimized.

Figure 18B:
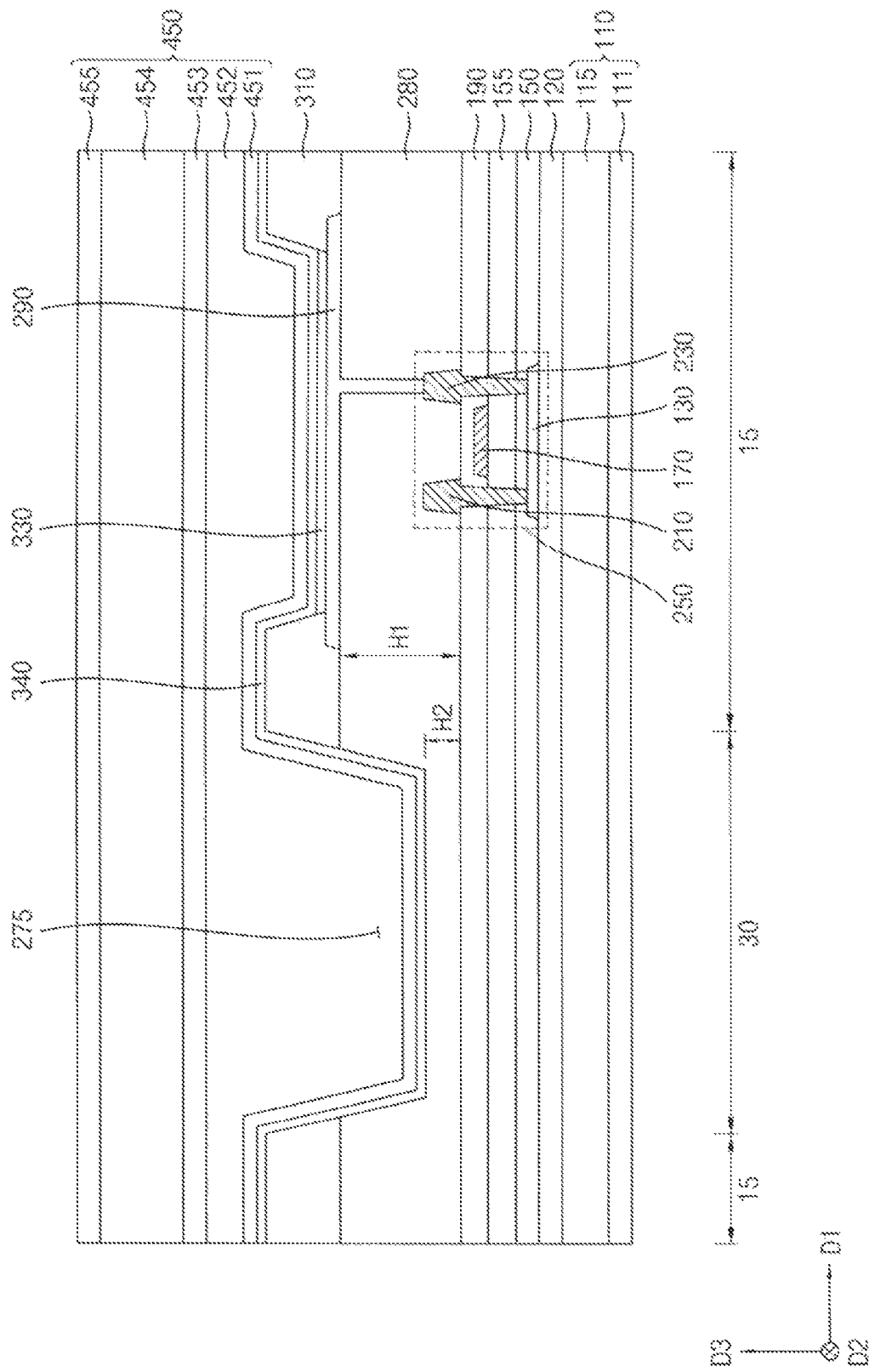
FIG. 18B is a cross-sectional view illustrating an OLED device in accordance with example embodiments.

In some example embodiments, as illustrated in FIG. 18B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170.

Figure 19A:
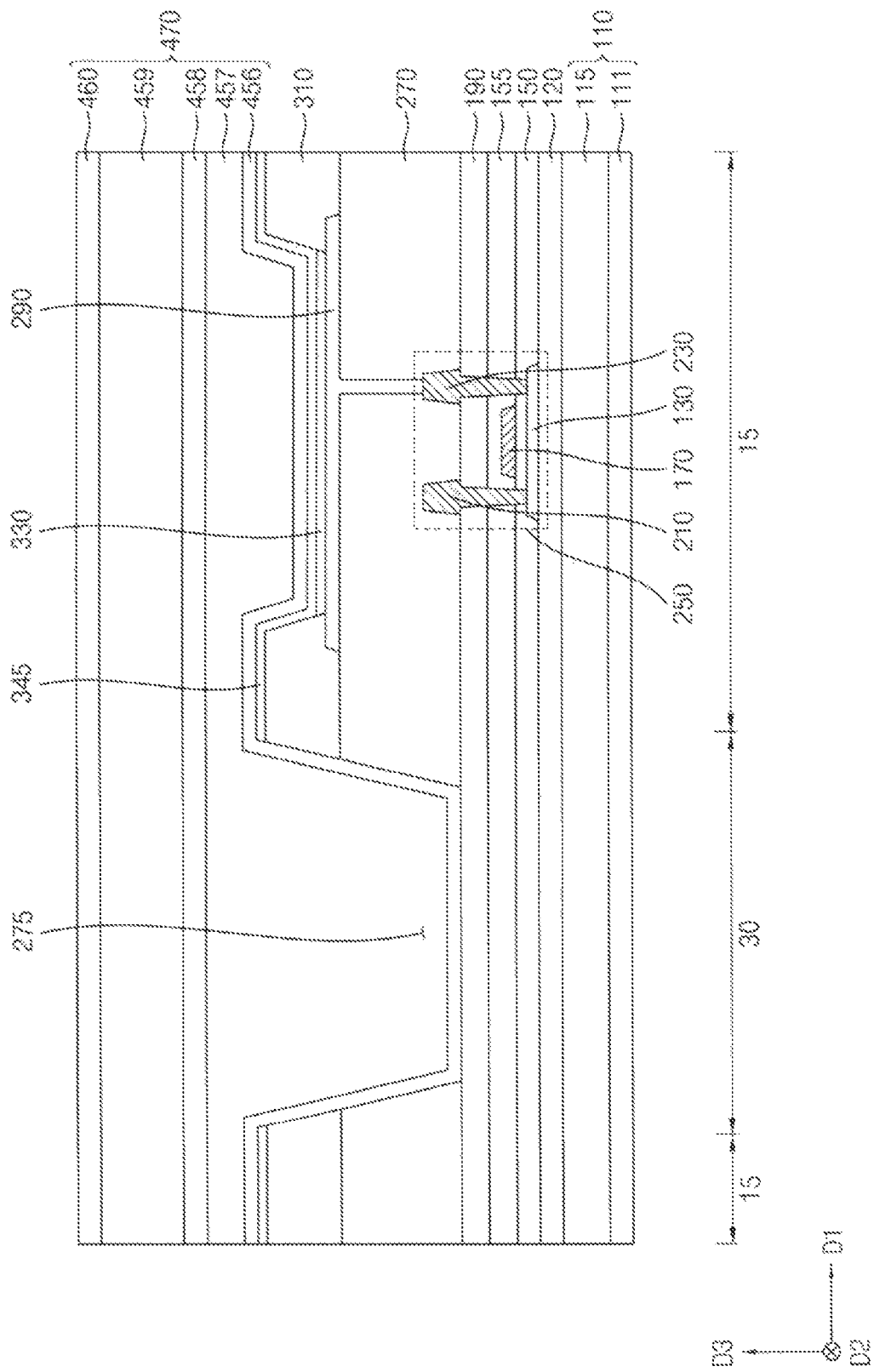
FIG. 19A is a cross-sectional view illustrating an OLED device in accordance with example embodiments.

FIG. 19A is a cross-sectional view illustrating further still another example of the OLED device of FIG. 13A. An OLED device illustrated in FIG. 19A may have a configuration substantially the same as or similar to that of an OLED device 300 described with reference to FIG. 13A. Regarding FIG. 19A, detailed descriptions for elements that are substantially the same as or similar to elements described with reference to FIG. 13A may not be repeated.

Referring to FIG. 19A, an OLED device may include a substrate 110, a buffer layer 120, a semiconductor element 250 (e.g., a switching element 250), a first gate insulation layer 150, a second gate insulation layer 155, a pixel structure, a first insulating interlayer 190, a planarization layer 270, a pixel defining layer 310, a thin film encapsulation layer 470, etc. Here, the substrate 110 may include a polyimide layer 111 and a barrier layer 115, and the pixel structure may include a first electrode 290, a light emitting layer 330, and a second electrode 345. In addition, the switching element 250 may include an active layer 130, a first gate electrode 170, a source electrode 210, and a drain electrode 230. The thin film encapsulation layer 470 may include first encapsulation layers 456, 458, and 460 and second encapsulation layers 457 and 459.

Compared to FIG. 13A, the second insulating interlayer 195 disposed on the first insulating interlayer 190 may be omitted.

In example embodiments, the second electrode 345 may be disposed on the pixel defining layer 310 and the light emitting layer 330. The second electrode 345 may cover the pixel defining layer 310 and the light emitting layer 330 in the sub-pixel region 15, and may expose the first insulating interlayer 190 in the transparent region 30. That is, the second electrode 345 may be disposed in the sub-pixel region 15, and may expose the transparent region 30. The second electrode 345 may include one or more of a metal, a metal alloy, metal nitride, conductive metal oxide, transparent conductive material(s), etc.

In example embodiments, the thin film encapsulation structure 470 may be disposed on the second electrode 345 in the sub-pixel region 15 and the first insulating interlayer 190 in the transparent region 30. The thin film encapsulation structure 470 may include at least one first encapsulation layer and at least one second encapsulation layer. The first encapsulation layers 456, 458, and 460 may include inorganic material(s) that have a refractive index in a range from 1.4 to 1.5 (e.g., a first refractive index). The second encapsulation layers 457 and 459 may include organic material(s) that have a refractive index in a range from 1.4 to 1.5.

As the thin film encapsulation structure 470 having the first refractive index is disposed in the transparent region 30, the second insulating interlayer may be omitted. That is, the thin film encapsulation structure 470 having the first refractive index may serve as the second insulating interlayer 195 of FIG. 13A. Accordingly, a thickness of the OLED device may be minimized, and/or manufacturing cost of the OLED device may be minimized.

Figure 19B:
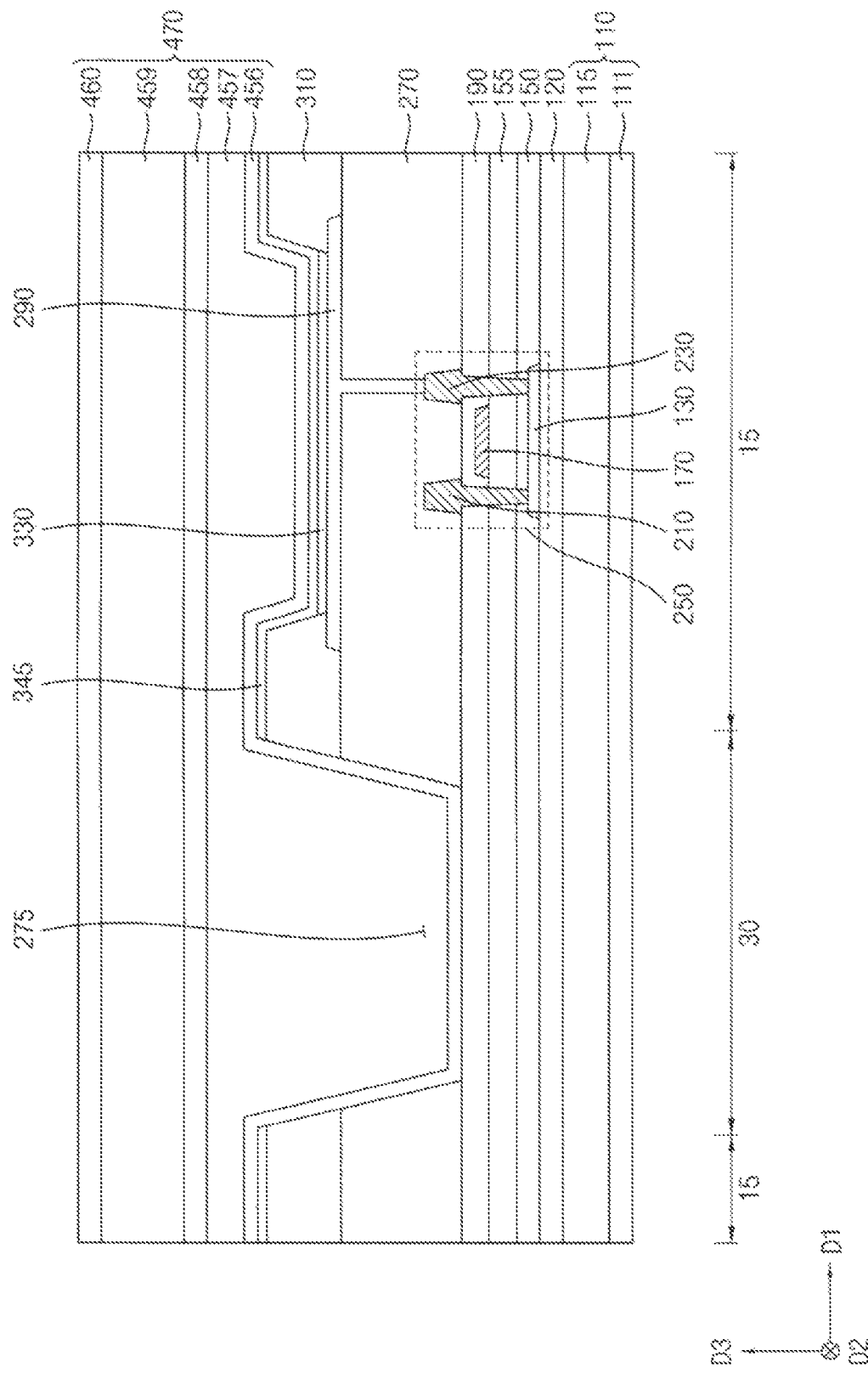
FIG. 19B is a cross-sectional view illustrating an OLED device in accordance with example embodiments.

In some example embodiments, as illustrated in FIG. 19B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170.

Figure 20A:
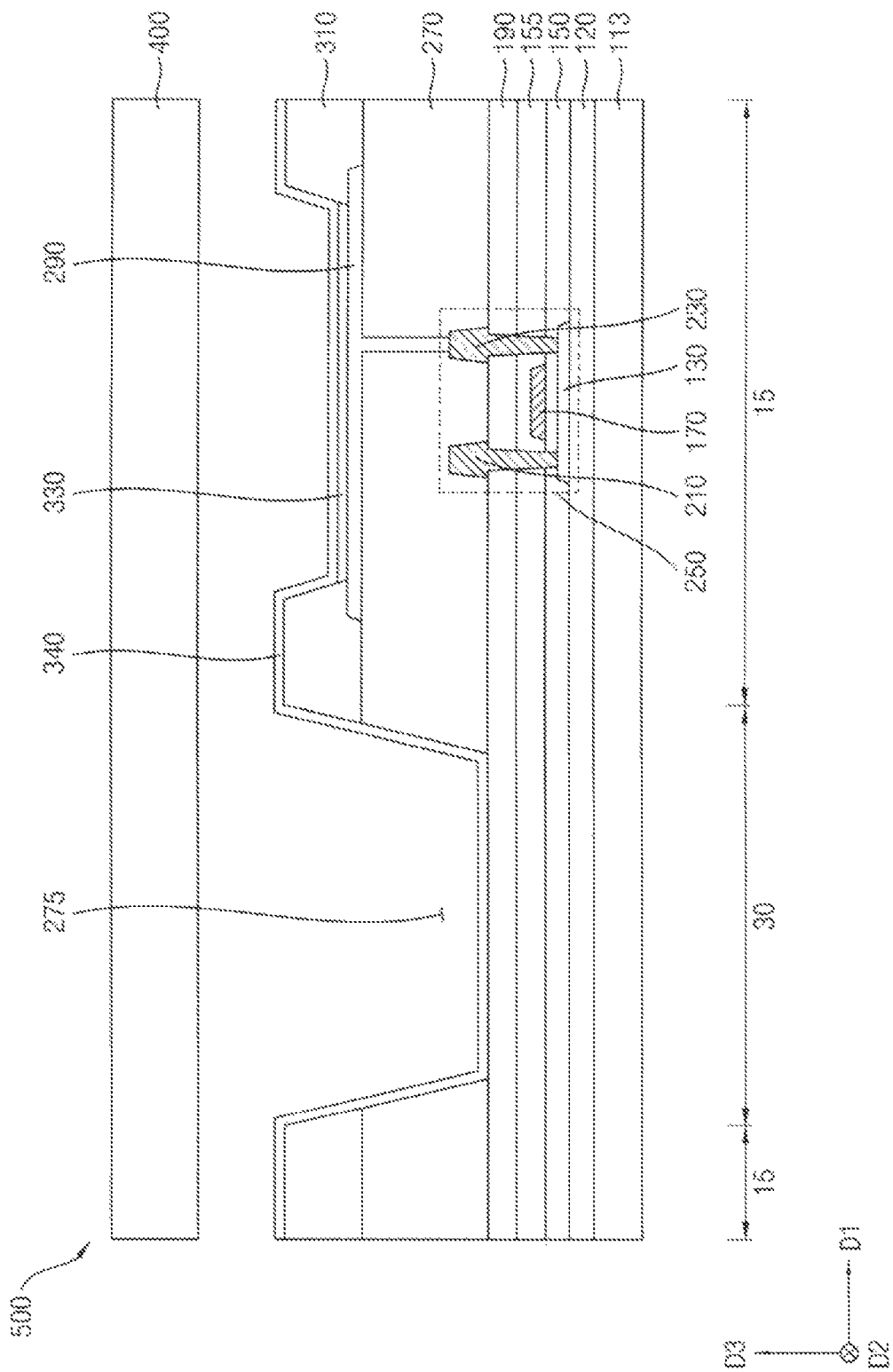
FIG. 20A is a cross-sectional view illustrating an OLED device in accordance with example embodiments.

FIG. 20A is a cross-sectional view illustrating an OLED device in accordance with example embodiments. An OLED device 500 illustrated in FIG. 20A may have a configuration substantially the same as or similar to that of an OLED device 100 described with reference to FIG. 2A except a substrate 113 and an encapsulation substrate 400. Regarding FIG. 20A, detailed descriptions for elements that are substantially the same as or similar to elements described with reference to FIG. 2A may not be repeated.

Referring to FIG. 20A, an OLED device 500 may include a substrate 113, a buffer layer 120, a semiconductor element 250 (e.g., a switching element 250), a first gate insulation layer 150, a second gate insulation layer 155, a pixel structure, a first insulating interlayer 190, a planarization layer 270, a pixel defining layer 310, an encapsulation substrate 400, etc. The pixel structure may include a first electrode 290, a light emitting layer 330, and a second electrode 340, and the switching element 250 may include an active layer 130, a first gate electrode 170, a source electrode 210, and a drain electrode 230.

The substrate 113 may include transparent insulation material(s). In example embodiments, the substrate 113 may consist essentially of a glass substrate that has a refractive index in a range from 1.4 to 1.5. For example, the substrate 113 may include one or more of a quartz substrate, a synthetic quartz substrate, a calcium fluoride substrate, a fluoride-doping quartz substrate, a soda lime substrate, a non-alkali substrate, etc.

The encapsulation substrate 400 may be disposed on the second electrode 340. The encapsulation substrate 400 and the substrate 113 may include substantially the same material(s). For example, the encapsulation substrate 400 may include one or more of a quartz substrate, a synthetic quartz substrate, a calcium fluoride substrate, a fluoride-doping quartz substrate, a soda lime substrate, a non-alkali substrate, etc.

In example embodiments, each of the substrate 113, the buffer layer 120, and the first gate insulation layer 150 may have substantially the same refractive index (value). In embodiments, as the OLED device 500 include each of the substrate 113, the buffer layer 120, and the first gate insulation layer 150 that have substantially the same refractive index (value), a transmittance of the transparent region 30 may be increased. In addition, as the active layer 130 may be interposed between the buffer layer 120 and the first gate insulation layer 150 that include SiOx, interface characteristics of the active layer 130 may be improved.

Figure 20B:
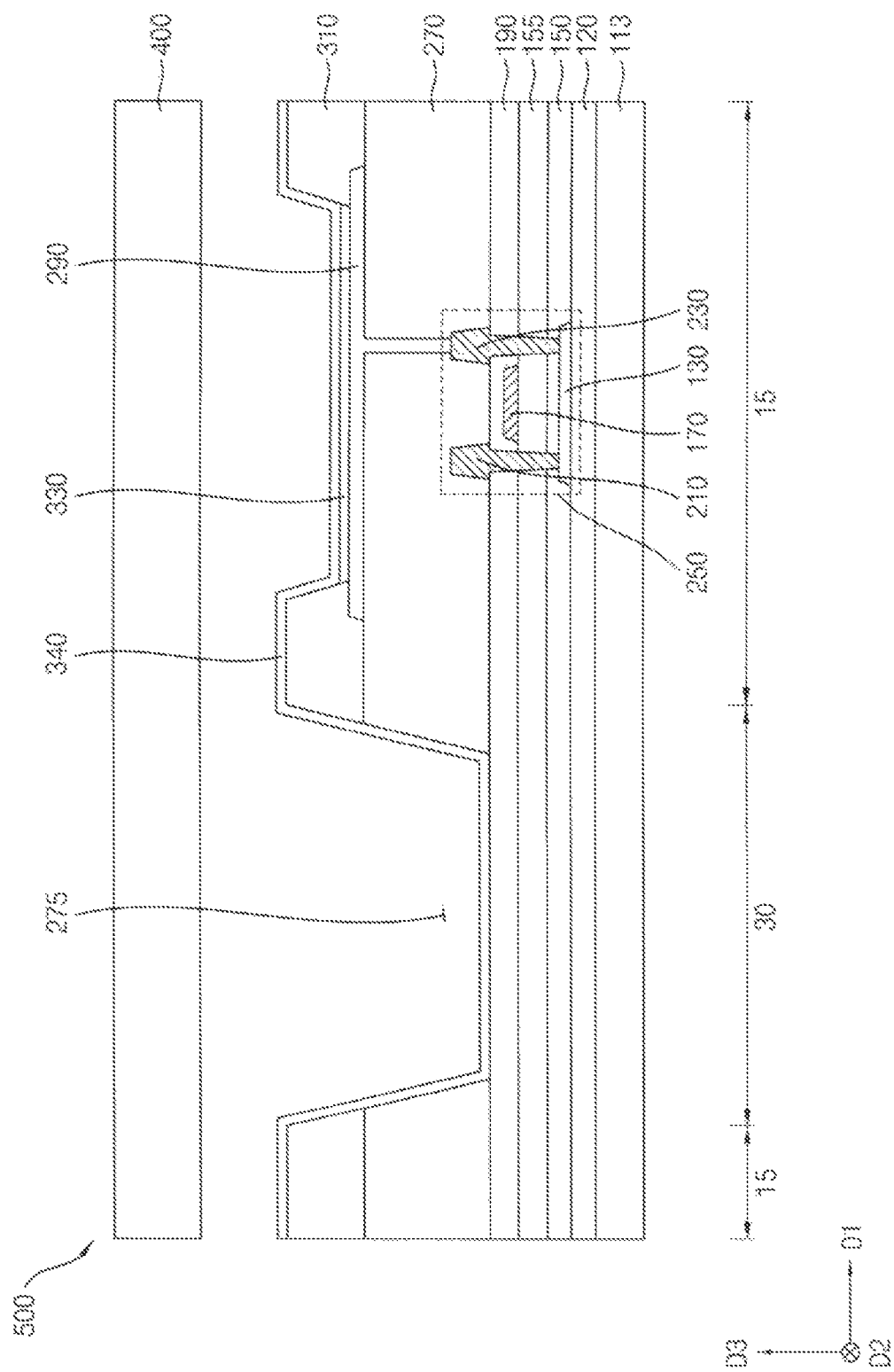
FIG. 20B is a cross-sectional view illustrating an OLED device in accordance with example embodiments.

In some example embodiments, as illustrated in FIG. 20B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170.

Figure 21:
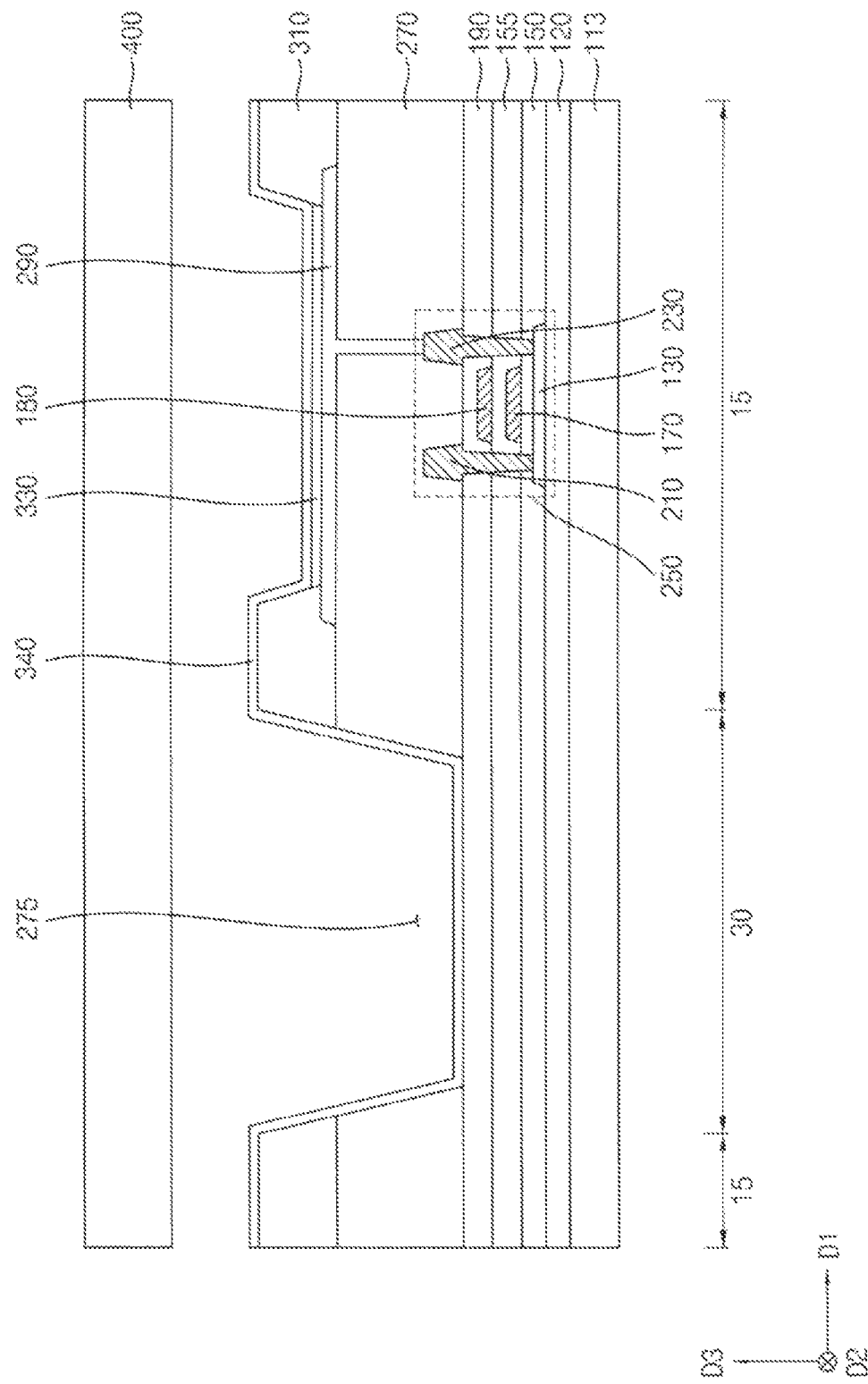
FIG. 21 is a cross-sectional view illustrating an OLED device in accordance with example embodiments.
Figure 22:
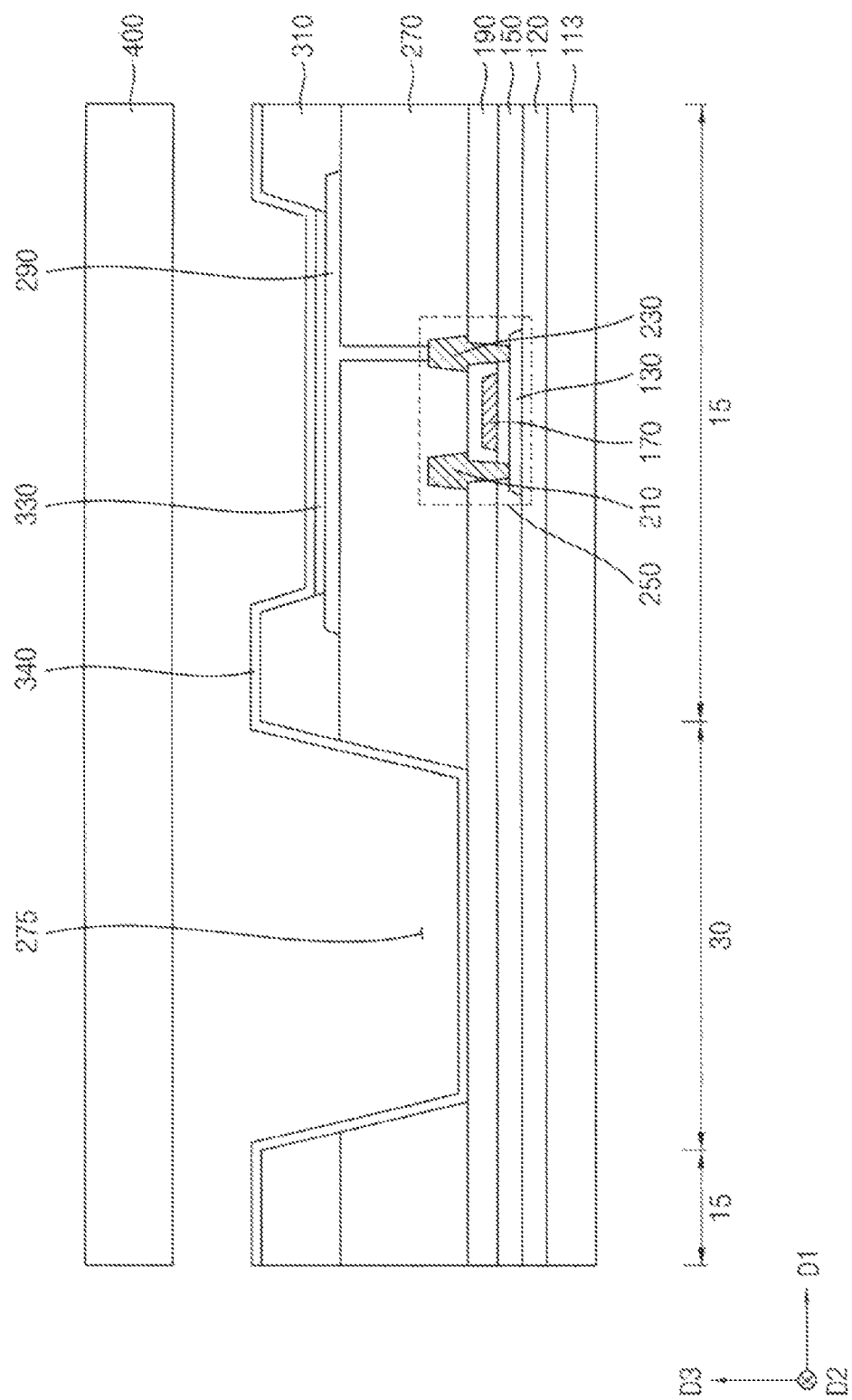
FIG. 22 is a cross-sectional view illustrating an OLED device in accordance with example embodiments.

FIG. 21 is a cross-sectional view illustrating an example of the OLED device of FIG. 20A, and FIG. 22 is a cross-sectional view illustrating another example of the OLED device of FIG. 20A. OLED devices illustrated in FIGS. 21 and 22 may have a configuration substantially the same as or similar to that of an OLED device 500 described with reference to FIG. 20A. In FIGS. 21 and 22, detailed descriptions for elements that are substantially the same as or similar to elements described with reference to FIG. 20A may not be repeated.

Referring to FIG. 21, an OLED device according to example embodiments may further include a second gate electrode 180. The second gate electrode 180 may be interposed between the second gate insulation layer 155 and the first insulating interlayer 190, and may be disposed on the second gate insulation layer 155 under which the first gate electrode 170 is disposed. The first gate electrode 170 and the second gate electrode 180 may serve as a capacitor. The second gate electrode 180 may include a metal, a metal alloy, metal nitride, conductive metal oxide, transparent conductive material(s), etc.

Referring to FIG. 22, compared to FIG. 20A, the second gate insulation layer 155 disposed on the first gate insulation layer 150 may be omitted. Accordingly, the gate insulation layer may consist essentially of (and/or may be essentially formed of) SiOx that has a refractive index in a range from 1.4 to 1.5. In embodiments, the gate insulation layer may have a substantially single composition of SiOx. That is, the first insulating interlayer 190 may cover the first gate electrode 170 in the sub-pixel region 15, and may be disposed on the entire first gate insulation layer 150. For example, the first insulating interlayer 190 may sufficiently cover the first gate electrode 170, and may have a substantially even surface without a step around the first gate electrode 170. In an embodiment, the first insulating interlayer 190 may cover the first gate electrode 170, and may be disposed as a substantially uniform thickness along a profile of the first gate electrode 170.

Figure 23A:
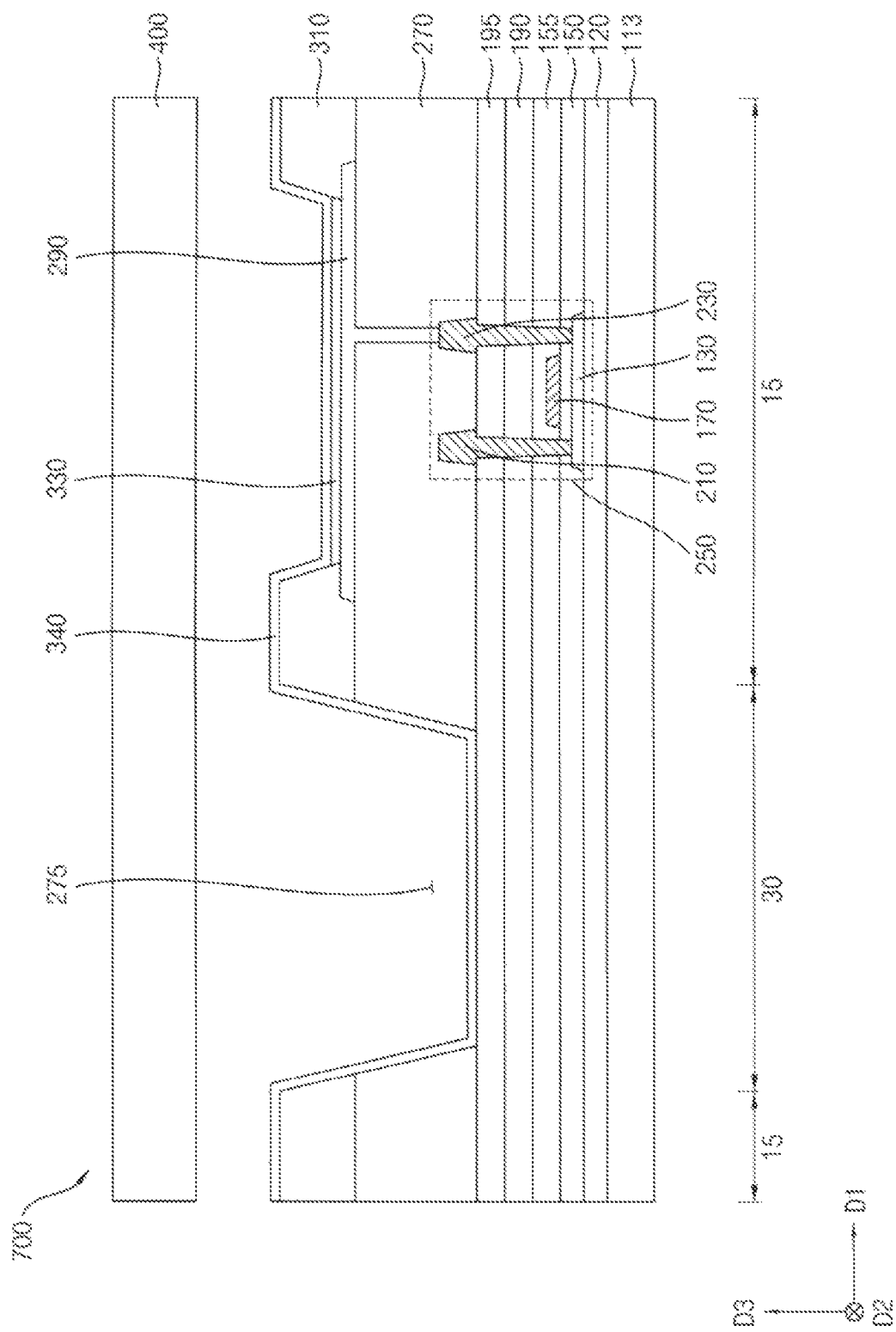
FIG. 23A is a cross-sectional view illustrating an OLED device in accordance with example embodiments.

FIG. 23A is a cross-sectional view illustrating an OLED device in accordance with example embodiments. An OLED device 700 illustrated in FIG. 23A may have a configuration substantially the same as or similar to that of an OLED device 500 described with reference to FIG. 20A except a second insulating interlayer 195. Regarding FIG. 23A, detailed descriptions for elements that are substantially the same as or similar to the elements described with reference to FIG. 20A may not be repeated.

Referring to FIG. 23A, an OLED device 700 may include a substrate 113, a buffer layer 120, a semiconductor element 250 (e.g., a switching element 250), a first gate insulation layer 150, a second gate insulation layer 155, a pixel structure, a first insulating interlayer 190, a second insulating interlayer 195, a planarization layer 270, a pixel defining layer 310, an encapsulation substrate 400, etc. Here, the pixel structure may include a first electrode 290, a light emitting layer 330, and a second electrode 340, and the switching element 250 may include an active layer 130, a first gate electrode 170, a source electrode 210, and a drain electrode 230.

The first insulating interlayer 190 may be disposed on the second gate insulation layer 155. The first insulating interlayer 190 may include organic material(s) or inorganic material(s) that have a refractive index in a range from 1.7 to 1.8 (e.g., a second refractive index). In example embodiments, the first insulating interlayer 190 may consist essentially of SiOxNy that has a refractive index in a range from 1.7 to 1.8. For example, SiOxNy may consist essentially of silicon, oxygen, and nitrogen in a weight ratio of about 3.95:1:1.7. That is, SiOxNy may be formed controlling the weight ratio such that a refractive index of SiOxNy has a refractive index in a range from 1.7 to 1.8. In an embodiment, SiOxNy may consist essentially of silicon, oxygen, and nitrogen in a weight ratio of about 2.5:1:0.88. In embodiments, the first insulating interlayer 190 may have a substantially single composition of SiOxNy.

In example embodiments, the second insulating interlayer 195 may be interposed between the first insulating interlayer 190 and the source and drain electrodes 210 and 230, and may disposed in the sub-pixel region 15 and the transparent region 30 on the first insulating interlayer 190. In addition, the second insulating interlayer 195 may have a refractive index in a range from 1.4 to 1.5 (e.g., a first refractive index).

As the second insulating interlayer 195 having the first refractive index that is less than the second refractive index is disposed on the first insulating interlayer 190 having the second refractive index, a transmittance in the transparent region 30 of the OLED device 700 may be increased. For example, when a light is transmitted from a first layer having a high refractive index into a second layer having a low refractive index, a transmittance of a light may be increased. In embodiments, the OLED device 700 may serve as a transparent flexible OLED device with satisfactory transmittance.

Figure 23B:
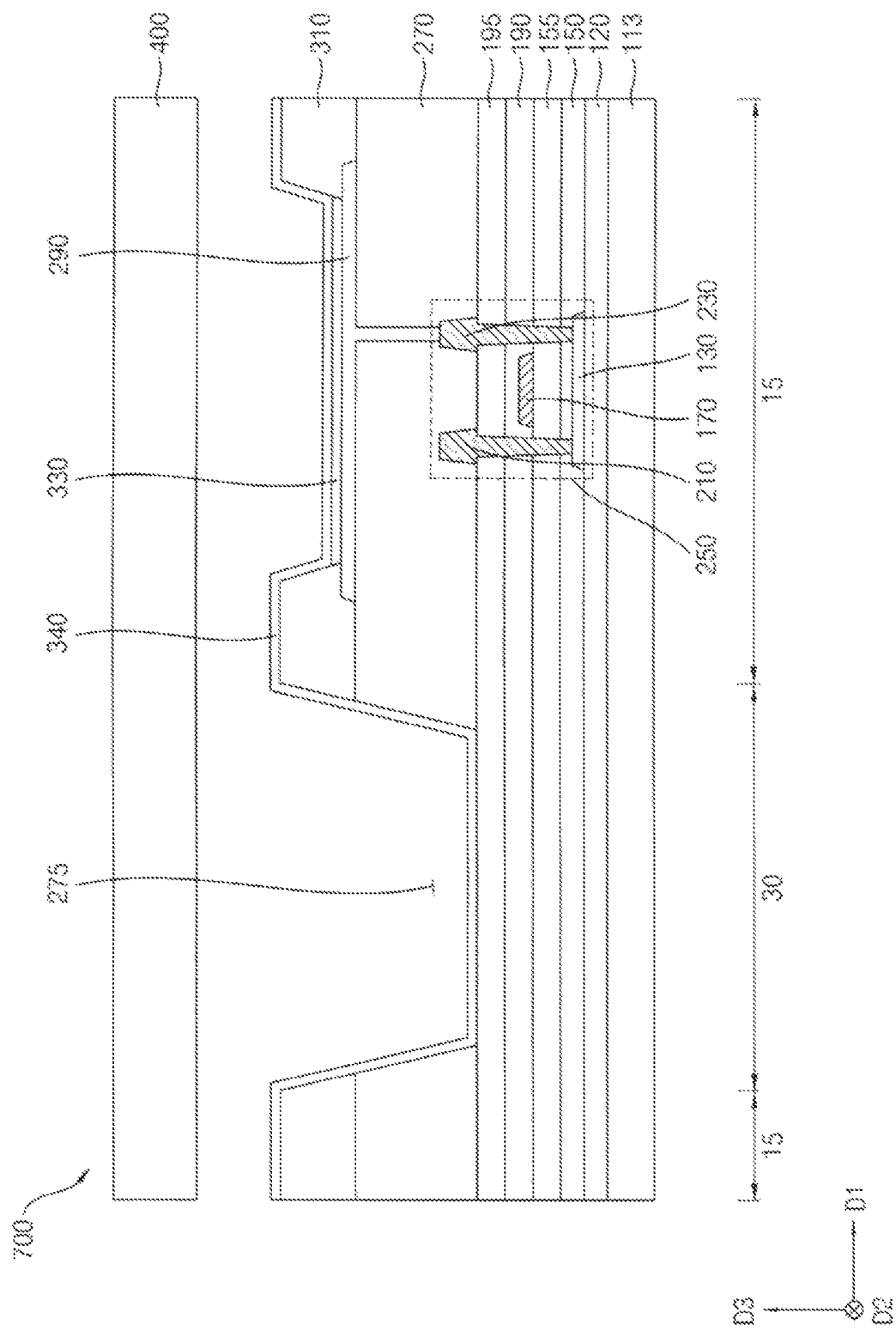
FIG. 23B is a cross-sectional view illustrating an OLED device in accordance with example embodiments.

In some example embodiments, as illustrated in FIG. 23B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170.

Figure 24A:
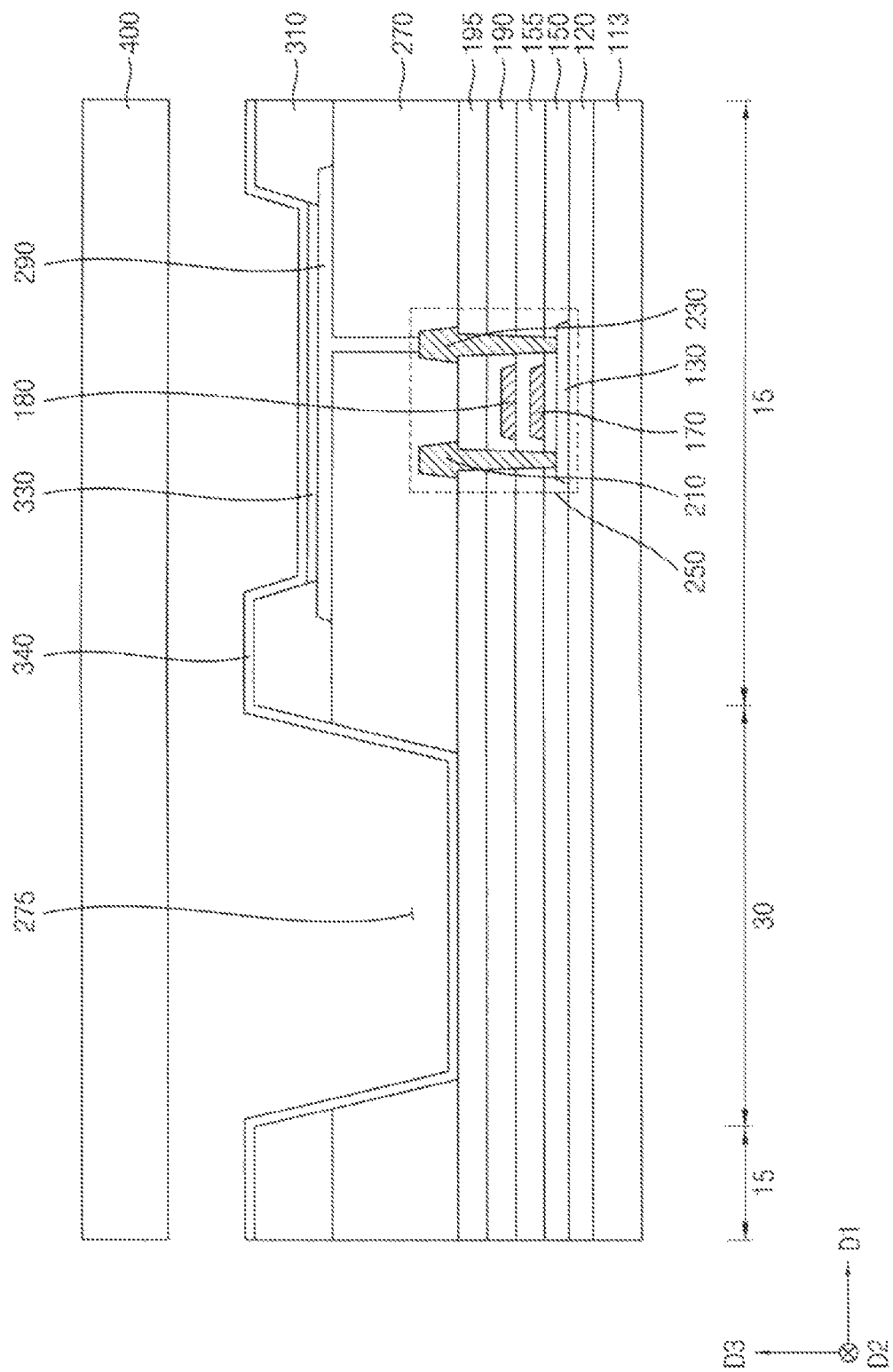
FIG. 24A is a cross-sectional view illustrating an OLED device in accordance with example embodiments.
Figure 25:
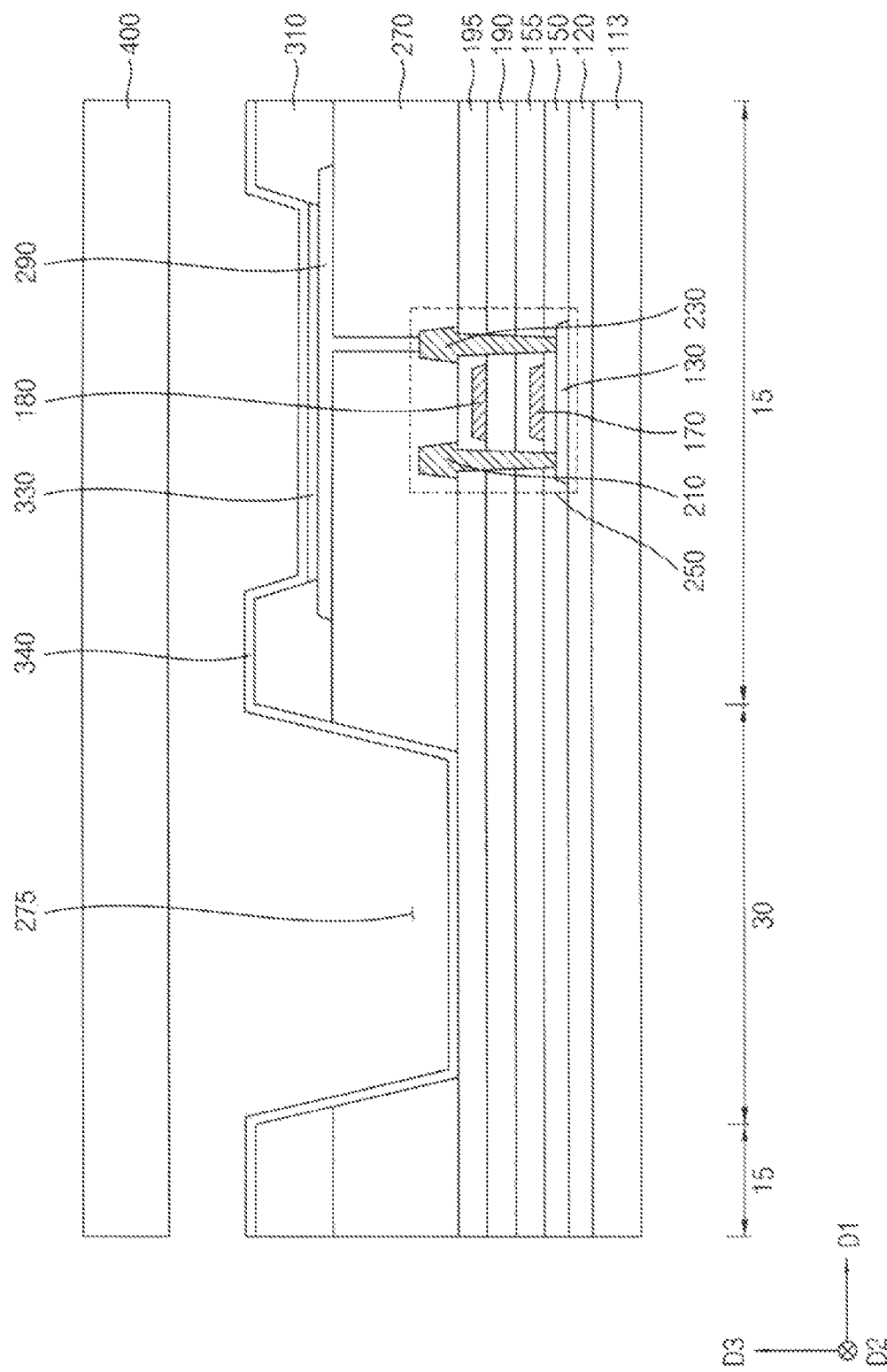
FIG. 25 is a cross-sectional view illustrating an OLED device in accordance with example embodiments.

FIG. 24A is a cross-sectional view illustrating an example of the OLED device of FIG. 23A, and FIG. 25 is a cross-sectional view illustrating another example of the OLED device of FIG. 23A. OLED devices illustrated in FIGS. 24A and 25 may have a configuration substantially the same as or similar to that of an OLED device 700 described with reference to FIG. 23A. Regarding FIGS. 24A and 25, detailed descriptions for elements that are substantially the same as or similar to elements described with reference to FIG. 23A may not be repeated.

Referring to FIGS. 24A and 25, an OLED device according to example embodiments may further include a second gate electrode 180. The second gate electrode 180 may be interposed between the second gate insulation layer 155 and the first insulating interlayer 190. For example, as illustrated in FIG. 24A, the second gate electrode 180 may be disposed on the second gate insulation layer 155 under which the first gate electrode 170 is disposed. In some example embodiments, as illustrated in FIG. 25, the second gate electrode 180 may be disposed on the first insulating interlayer 190 under which the first gate electrode 170 is disposed.

The first gate electrode 170 and the second gate electrode 180 may serve as a capacitor. The second gate electrode 180 may include one or more of a metal, a metal alloy, metal nitride, conductive metal oxide, transparent conductive material(s), etc.

Figure 24B:
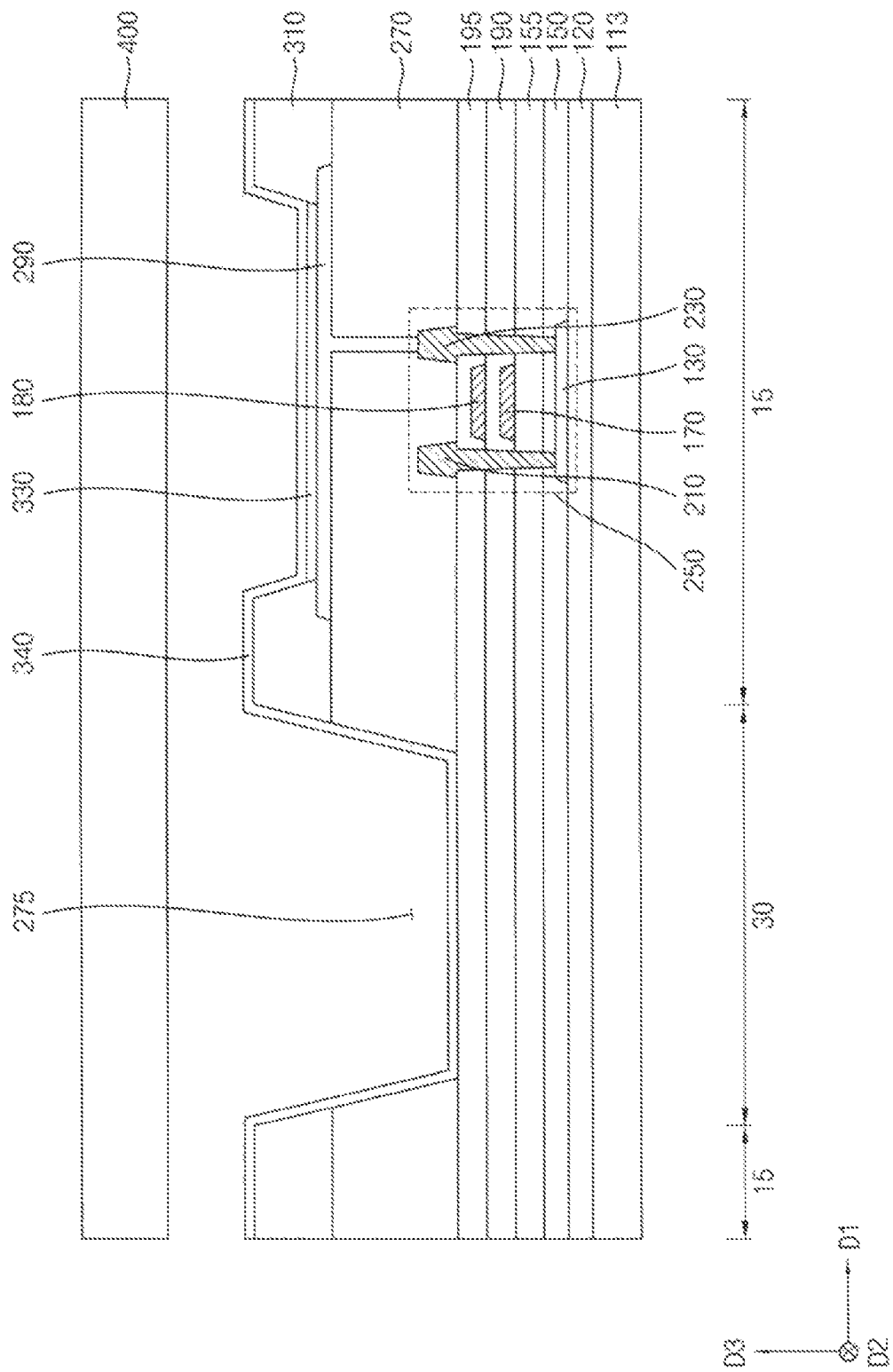
FIG. 24B is a cross-sectional view illustrating an OLED device in accordance with example embodiments.

In some example embodiments, as illustrated in FIG. 24B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170, and the second gate electrode 180 may be interposed between the first insulating interlayer 190 and the second insulating interlayer 195. That is, the second gate electrode 180 may be disposed on the first insulating interlayer 190 under which the first gate electrode 170 is located.

Figure 26A:
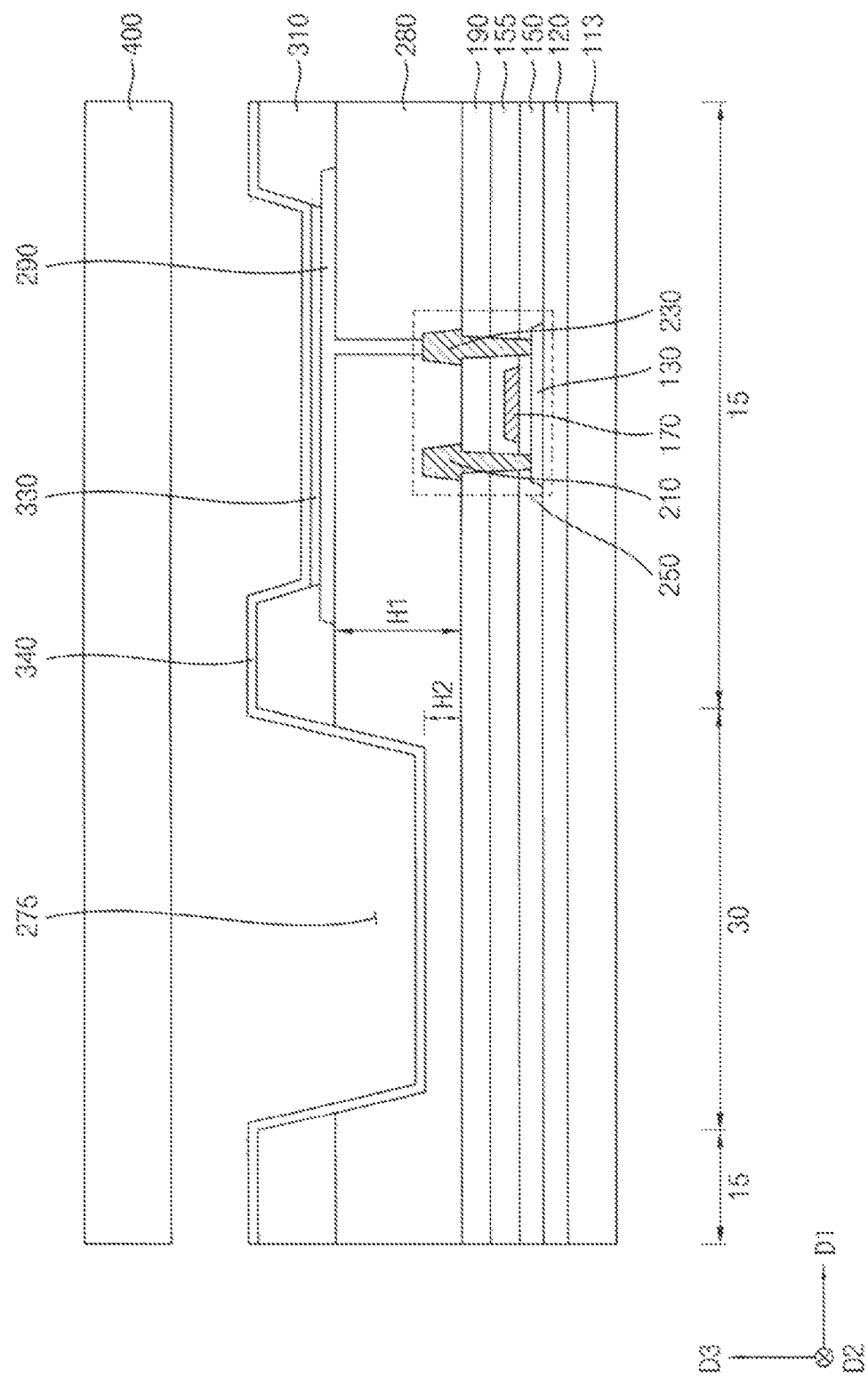
FIG. 26A is a cross-sectional view illustrating an OLED device in accordance with example embodiments.

FIG. 26A is a cross-sectional view illustrating still another example of the OLED device of FIG. 23A. An OLED device illustrated in FIG. 26A may have a configuration substantially the same as or similar to that of an OLED device 700 described with reference to FIG. 23A. Regarding FIG. 26A, detailed descriptions for elements that are substantially the same as or similar to elements described with reference to FIG. 23A may not be repeated.

Referring to FIG. 26A, an OLED device may include a substrate 113, a buffer layer 120, a semiconductor element 250 (e.g., a switching element 250), a first gate insulation layer 150, a second gate insulation layer 155, a pixel structure, a first insulating interlayer 190, a planarization layer 280, a pixel defining layer 310, an encapsulation substrate 400, etc. Here, the pixel structure may include a first electrode 290, a light emitting layer 330, and a second electrode 340, and the switching element 250 may include an active layer 130, a first gate electrode 170, a source electrode 210, and a drain electrode 230.

Compared to FIG. 23A, the second insulating interlayer 195 disposed on the first insulating interlayer 190 may be omitted.

In example embodiments, the planarization layer 280 may be disposed in the sub-pixel region 15 and the transparent region 30 on the source electrode 210, the drain electrode 230, and the first insulating interlayer 190. The planarization layer 280 may include organic material(s) or inorganic material(s) that have a refractive index in a range from 1.4 to 1.5 (e.g., a first refractive index). The planarization layer 280 may have a first height H1 in the sub-pixel region 15, and the first height H1 may extend in a third direction D3 that is vertical to an upper surface of the substrate 113. The planarization layer 280 may have a second height H2 in the transparent region 30, and the second height H2 extending in the third direction D3 may be less than the first height H1. As the planarization layer 280 having the second height H2 and the first refractive index in the transparent region 30 is disposed, the second insulating interlayer may be omitted. That is, the planarization layer 280 having the second height H2 and the first refractive index may serve as the second insulating interlayer 195 of FIG. 23A. Accordingly, a thickness of the OLED device may be minimized, and/or manufacturing cost of the OLED device may be minimized.

Figure 26B:
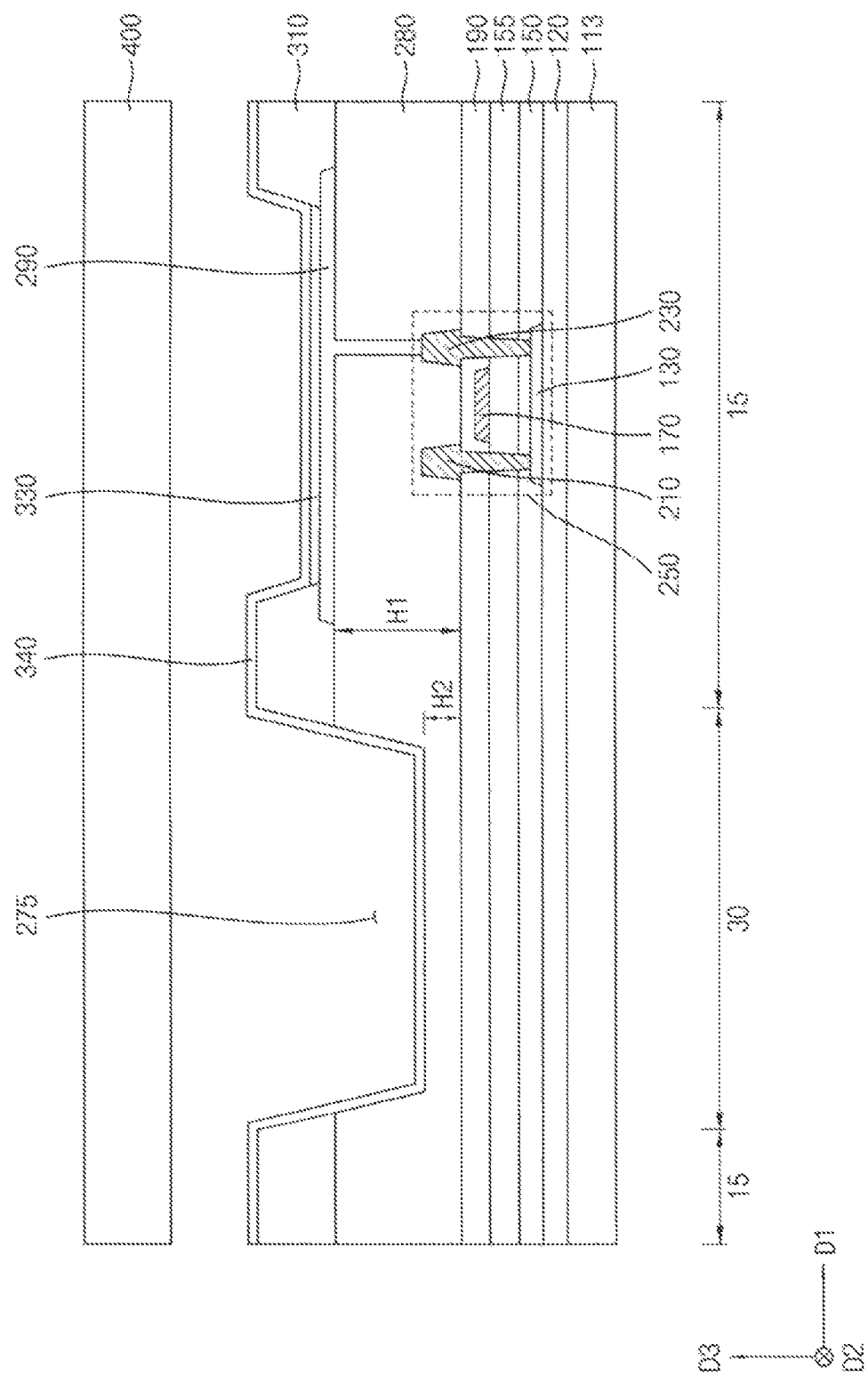
FIG. 26B is a cross-sectional view illustrating an OLED device in accordance with example embodiments.

In some example embodiments, as illustrated in FIG. 26B, the first gate insulation layer 150 may be disposed on the active layer 130, and the second gate insulation layer 155 may be disposed on the first gate insulation layer 150. In addition, the first gate electrode 170 may be disposed on the second gate insulation layer 155. That is, the first and second gate insulation layer 150 and 155 may be interposed between the buffer layer 120 and the gate electrode 170. In addition, the first insulating interlayer 190 may be disposed on the second gate insulation layer 155 and the first gate electrode 170.

Embodiments may be applied to various display devices, including organic light emitting display devices. Embodiments may be applied to one or more of in-vehicle display devices, in-ship display devices, in-aircraft display devices, portable communication devices, display devices for information transfer, medical display devices, etc.

The foregoing is illustrative of example embodiments and is not to be construed as limiting. Although example embodiments have been described, those skilled in the art will readily appreciate that many modifications are possible in the example embodiments. All such modifications are intended to be included within the scope defined in the claims.

What is claimed is:

1. An organic light emitting display (OLED) device, comprising:
    a substrate including a sub-pixel region and a transparent region;
    a buffer layer in the sub-pixel region and the transparent region on the substrate, the buffer layer having a first refractive index;
    a first gate insulation layer in the sub-pixel region and the transparent region on the buffer layer, the first gate insulation layer including the same material with the buffer layer;
    an active layer between the buffer layer and the first gate insulation layer;
    a first gate electrode on the first gate insulation layer under which the active layer is disposed;
    a first insulating interlayer in the sub-pixel region and the transparent region on the first gate insulation layer, the first insulating interlayer having a second refractive index that is greater than the first refractive index;
    a second gate insulation layer in the sub-pixel region and the transparent region between the first gate insulation layer and the first insulating interlayer;
    a second gate electrode interposed between the second gate insulation layer and the first insulating interlayer;
    source and drain electrodes on the first insulating interlayer, the source and drain electrodes defining a semiconductor element together with the active layer and the first gate electrode; and
    a pixel structure on the semiconductor element, the pixel structure being electrically connected to the semiconductor element.

2. The OLED device of claim 1, wherein the first refractive index is in a range between about 1.4 and about 1.5, and the second refractive index is in a range between about 1.7 and about 1.8, and
    wherein an upper surface of the active layer is in contact with the first gate insulation layer, and a lower surface of the active layer is in contact with the buffer layer.

3. The OLED device of claim 1, wherein the substrate includes transparent insulation materials.

4. The OLED device of claim 3, wherein the substrate consists essentially of a transparent polyimide substrate that has a refractive index in a range between about 1.7 and about 1.8.

5. The OLED device of claim 4, wherein the substrate includes a transparent polyimide layer and a barrier layer, and the barrier layer is interposed between the transparent polyimide layer and the buffer layer, and
wherein the barrier layer and the first insulating interlayer include the same material.

6. The OLED device of claim 5, wherein the barrier layer consists essentially of silicon oxynitride that has a refractive index in a range between about 1.7 and about 1.8, and
wherein the silicon oxynitride consists essentially of silicon, oxygen, and nitrogen in a respective weight ratio of about 3.95:1:1.7.

7. The OLED device of claim 4, wherein each of the buffer layer and the first gate insulation layer consists essentially of silicon oxide that has a refractive index in a range between about 1.4 and about 1.5.

8. The OLED device of claim 4, wherein the active layer consists essentially of amorphous silicon or polysilicon.

9. The OLED device of claim 4, wherein the first insulating interlayer consists essentially of silicon oxynitride that has a refractive index in a range between about 1.7 and about 1.8, and
wherein the silicon oxynitride consists essentially of silicon, oxygen, and nitrogen in a respective weight ratio of about 3.95:1:1.7.

10. The OLED device of claim 4, wherein the first gate electrode is disposed between the first gate insulation layer and the second gate insulation layer, and the second gate insulation layer and the first insulating interlayer include the same material.

11. The OLED device of claim 10, wherein the second gate insulation layer consists essentially of silicon oxynitride that has a refractive index in a range between about 1.7 and about 1.8, and
wherein the silicon oxynitride consists essentially of silicon, oxygen, and nitrogen in a respective weight ratio of about 3.95:1:1.7.

12. The OLED device of claim 10, wherein the second gate electrode is disposed on the second gate insulation layer under which the first gate electrode is disposed.

13. The OLED device of claim 4, further comprising:
a planarization layer covering the source and drain electrodes on the first insulating interlayer.

14. The OLED device of claim 13, wherein the planarization layer is disposed in the sub-pixel region on the first insulating interlayer, and exposes the transparent region.

15. The OLED device of claim 13, wherein the planarization layer is disposed in the sub-pixel region and the transparent region on the first insulating interlayer, and has the first refractive index,
wherein the planarization layer has a first height in the sub-pixel region, and the first height extends in a direction that is vertical to an upper surface of the substrate, and
wherein the planarization layer has a second height in the transparent region, and the second height extending in the direction is less than the first height.

16. The OLED device of claim 4, wherein the pixel structure includes:
a first electrode on the first insulating interlayer;
a light emitting layer on the first electrode; and
a second electrode on the light emitting layer.

17. The OLED device of claim 16, wherein the second electrode is disposed in the sub-pixel region and the transparent region.

18. The OLED device of claim 16, further comprising:
a thin film encapsulation structure on the pixel structure, the thin film encapsulation structure including at least one a first encapsulation layer and at least one a second encapsulation layer,
wherein the first and second encapsulation layers are alternately arranged,
wherein the first encapsulation layer includes inorganic materials that have a refractive index in a range between about 1.4 and about 1.5, and
wherein the second encapsulation layer includes organic materials that have a refractive index in a range between about 1.4 and about 1.5.

19. The OLED device of claim 18, wherein the first encapsulation layer includes silicon oxynitride.

20. The OLED device of claim 18, wherein the second electrode is disposed in the sub-pixel region, and exposes the transparent region, and
wherein the thin film encapsulation structure is in contact with the first insulating interlayer in the transparent region.

21. The OLED device of claim 3, wherein the substrate consists essentially of a glass substrate that has a refractive index in a range between about 1.4 and about 1.5.

22. The OLED device of claim 21, wherein the buffer layer and the first gate insulation layer consist essentially of silicon oxide that has a refractive index in a range between about 1.4 and about 1.5,
wherein the active layer consists essentially of amorphous silicon or poly silicon,
wherein the first insulating interlayer consists essentially of silicon oxynitride that has a refractive index in a range between about 1.7 and about 1.8, and
wherein the silicon oxynitride consists essentially of silicon, oxygen, and nitrogen in a respective weight ratio of about 3.95:1:1.7.

* * * * *